(12) United States Patent
Morikado

(10) Patent No.: US 8,362,543 B2
(45) Date of Patent: Jan. 29, 2013

(54) SEMICONDUCTOR NONVOLATILE MEMORY DEVICE WITH INTER-GATE INSULATING FILM FORMED ON THE SIDE SURFACE OF A MEMORY CELL AND METHOD FOR MANUFACTURING THE SAME

(75) Inventor: Mutsuo Morikado, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 402 days.

(21) Appl. No.: 12/337,265

(22) Filed: Dec. 17, 2008

(65) Prior Publication Data
US 2009/0206390 A1    Aug. 20, 2009

(30) Foreign Application Priority Data

Dec. 17, 2007 (JP) ................ P2007-325309

(51) Int. Cl.
*H01L 29/72* (2006.01)
(52) U.S. Cl. ......... 257/316; 257/324; 257/401; 257/411
(58) Field of Classification Search .................. 257/316, 257/324, 401, 411
See application file for complete search history.

(56) References Cited

U.S. PATENT DOCUMENTS 6,828,627 B2    12/2004 Goda et al.
2005/0029573 A1*  2/2005 Sato et al. ............... 257/314

FOREIGN PATENT DOCUMENTS

JP    08-64700    3/1996

* cited by examiner

*Primary Examiner* — Edward Wojciechowicz
(74) *Attorney, Agent, or Firm* — Oblon, Spivak, McClelland, Maier & Neustadt, L.L.P.

(57) ABSTRACT

A nonvolatile semiconductor device and method having a plurality of series-connected memory cells with floating and control gate electrodes, and a first insulating layer formed between the gate electrodes. One of the memory cells has the floating gate formed to contact the control gate electrode through an aperture in the insulating layer. The insulating layer is removed to form spaces between the gate electrodes. A second insulating film is formed in the spaces between the gate electrodes. The dummy electrode supports the series of gate electrodes to maintain the spaces between the electrodes. The second insulating layer is formed to be continuous in the spaces and on side surfaces of the gate electrodes. The second insulating layer may have a stacked structure with n layers in the spaces and (n−1)/2 layers on the side surfaces.

12 Claims, 32 Drawing Sheets

SEMICONDUCTOR NONVOLATILE MEMORY DEVICE WITH INTER-GATE INSULATING FILM FORMED ON THE SIDE SURFACE OF A MEMORY CELL AND METHOD FOR MANUFACTURING THE SAME

CROSS REFERENCE TO RELATED APPLICATIONS

This application is based upon and claims the benefit of priority from the prior Japanese Patent Application No. 2007-325309, filed on Dec. 17, 2007, the entire contents of which are incorporated herein by reference.

BACKGROUND OF THE INVENTION

1. Field of the Invention

The present invention relates to a nonvolatile semiconductor memory device in which an element isolation trench for isolating elements is formed, and relates to a method for manufacturing the same.

2. Description of the Related Art

Heretofore, an electrically erasable programmable read-only memory (EEPROM), which is capable of electrically rewriting data, has been known as a nonvolatile semiconductor memory. A MOS transistor, having a stacked gate structure formed by stacking a floating gate serving as a charge storage layer and a control gate, is generally used in a memory cell of the EEPROM.

One of the EEPROMs most suitable for increasing its capacity is a NAND type EEPROM disclosed in Japanese Patent Application Publication No. Hei 8-64700. The NAND type EEPROM includes a NAND cell unit in which multiple memory cells are connected to each other in series in such a manner that each adjacent two memory cells share a source/drain diffusion layer, and the multiple NAND cell units are arranged to form a NAND cell array. Each of the NAND cell units is provided with selection gate transistors arranged on both edges thereof, and is connected to a bit line and a common source line through the selection gate transistors.

The floating gates are separated for each memory cell, while the control gate is continuously patterned and formed as a word line (control gate line) shared by the memory cells arranged in one direction. The gate electrode of the selection gate transistor is also disposed in parallel with the word line as a selection gate line. A bit line disposed orthogonal to the word line is connected to the diffusion layer of the drain-side selection gate transistor of the NAND cell unit. A common source line is connected to the diffusion layer of the source-side selection gate transistor of the NAND cell unit.

Such a NAND cell unit has to drive a high voltage of, for example, 20V or more for writing to or erasing from a memory cell. However, in recent years, the miniaturization of the NAND cell unit has been advanced, so that the space between the word lines becomes narrower than the thickness of the gate oxide film of a high-voltage resistant transistor. Consequently, there arises a problem that voltage resistance between word lines is insufficient.

SUMMARY OF THE INVENTION

According to one aspect of the present invention, there is provided a nonvolatile semiconductor memory device comprising a plurality of memory cells formed on a semiconductor substrate, wherein the memory cells each including: a first insulating film; a floating gate formed through the first insulating film on the semiconductor substrate; a control gate formed on the floating gate; and a second insulating film which continuously cover at least the space between the floating gate and the control gate, and the side surface along a word line of the floating gate and the control gate.

BRIEF DESCRIPTION OF THE DRAWINGS

FIG. 12D is a cross-sectional view taken along line IV-IV' of FIG. 1 showing the NAND type EEPROM in the order of manufacturing processes.

FIG. 13D is a cross-sectional view taken along line IV-IV' of FIG. 1 showing the NAND type EEPROM in the order of manufacturing processes.

FIG. 14D is a cross-sectional view taken along line IV-IV' of FIG. 1 showing the NAND type EEPROM in the order of manufacturing processes.

FIG. 16D is a cross-sectional view taken along line IV-IV' of FIG. 1 showing the NAND type EEPROM in the order of manufacturing processes.

DETAILED DESCRIPTION OF THE PREFERRED EMBODIMENTS

Figure 1:
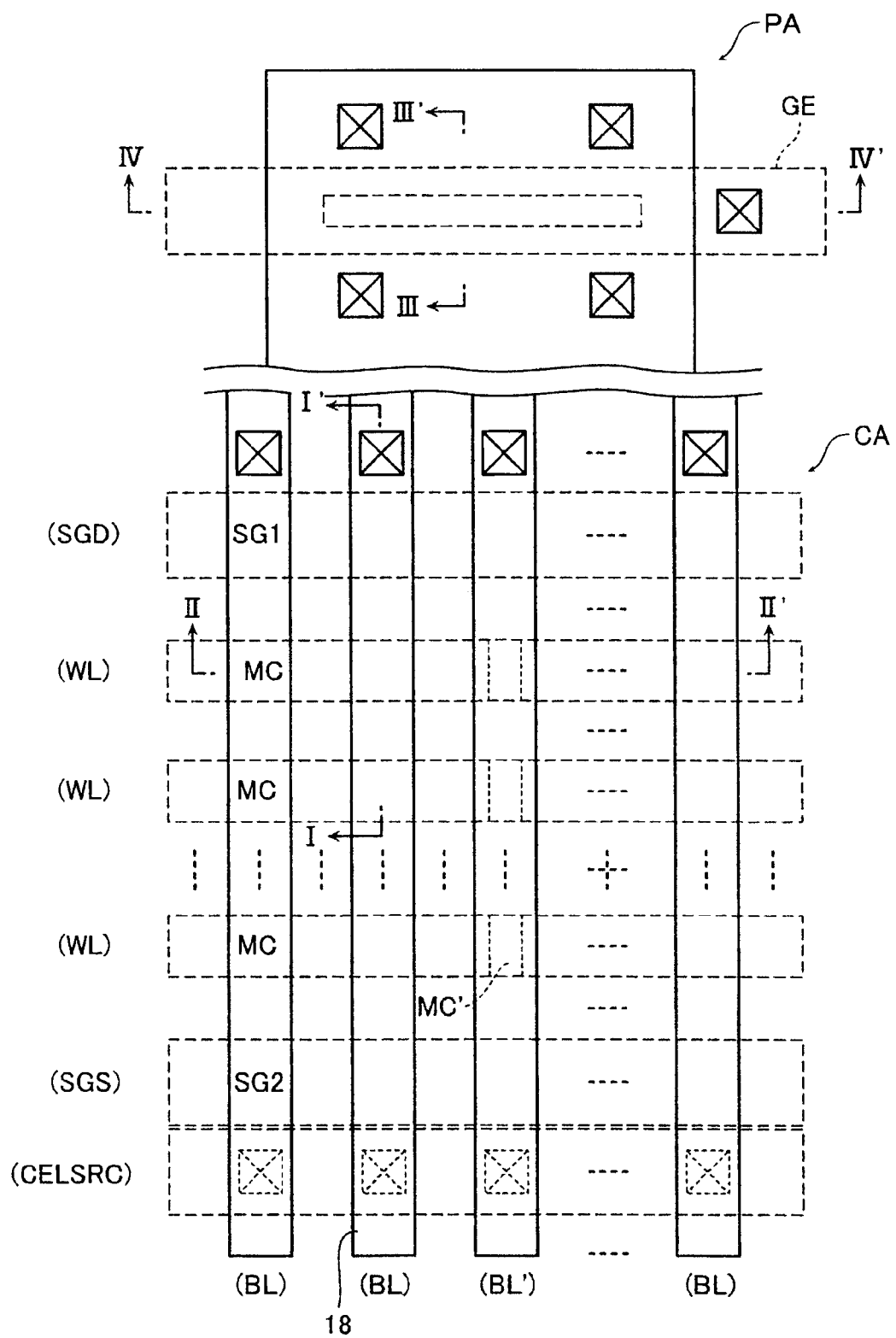
FIG. 1 is a plan view showing a cell area and a peripheral circuit transistor area of a NAND type EEPROM (nonvolatile semiconductor memory device) according to a first embodiment of the present invention.

According to the present invention, it is possible to provide a nonvolatile semiconductor memory device having sufficient voltage resistance between word lines, and a method for manufacturing the same.

Embodiments of the present invention will be described below in detail with reference to the accompanying drawings. In the drawings, the corresponding parts are indicated by the corresponding reference numerals. The embodiments described below are given as an example, and can be modified in various ways within the scope not deviating from the spirit of the present invention.

First Embodiment

FIG. 1 is a plan view showing a cell area CA and a peripheral circuit transistor area PA of a NAND type EEPROM (nonvolatile semiconductor memory device) according to a first embodiment of the present invention.

In the cell area CA, multiple bit lines BL extending in a longitudinal direction in the figure are formed. In a layer under these bit lines BL, selection gates SGD and SGS, a common source line CELSRC and multiple word lines WL are formed. The selection gates SGD and SGS, and the common source line CELSRC extend in a lateral direction in a manner orthogonal to the bit lines BL. The word lines WL are sandwiched between the selection gates SGD and SGS, and extend in parallel with these gates.

A memory cell MC is formed under each intersecting portion between the word line WL and the bit line BL. Selection gate transistors SG1 and SG2 are formed under each intersecting portion between the selection gate SGD and the bit line BL, and between the selection gate SGS and the bit line BL, respectively.

Figure 2:
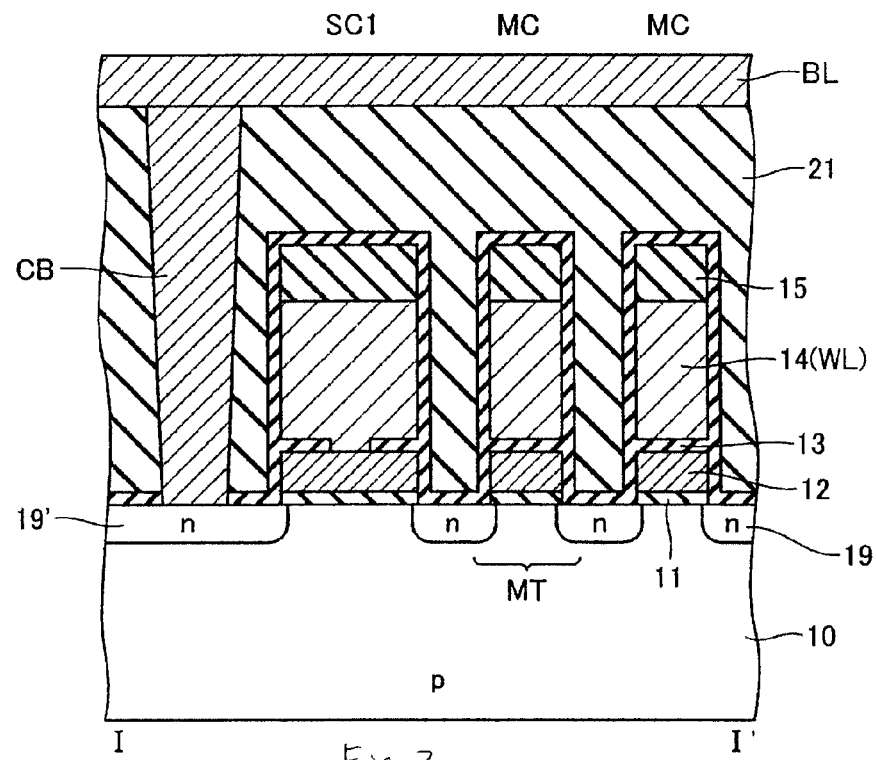
FIG. 2 is a cross-sectional view taken along line I-I' of FIG. 1.
Figure 3:
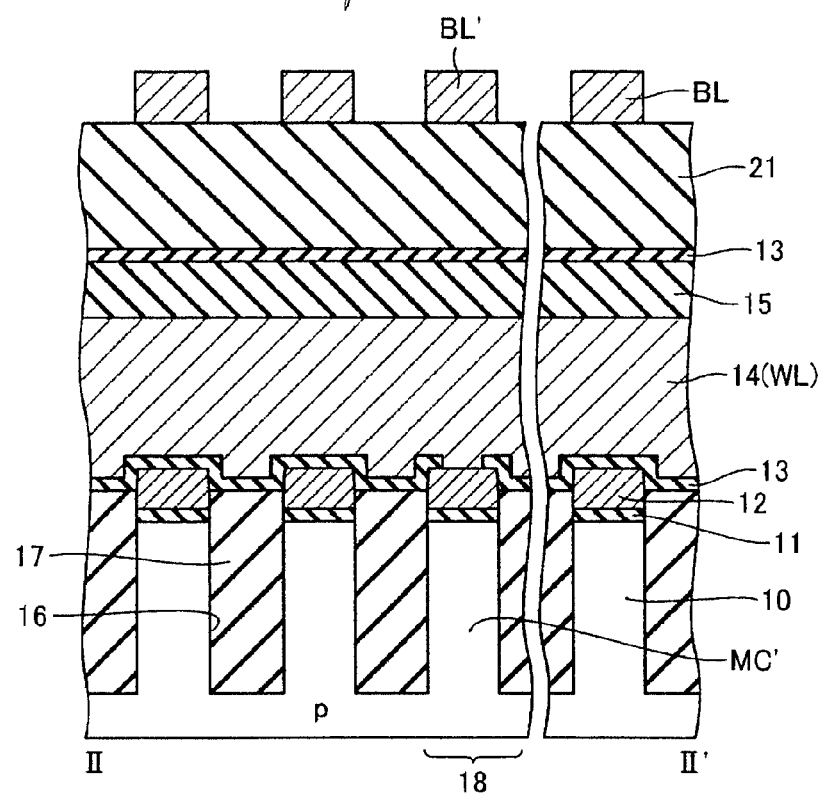
FIG. 3 is a cross-sectional view taken along line II-II' of FIG. 1.

FIG. 2 is a cross-sectional view (cross-sectional view taken along line I-I' of FIG. 1) showing the cell area along the bit line BL of the NAND type EEPROM according to the present embodiment. FIG. 3 is a cross-sectional view (cross-sectional view taken along line II-II' of FIG. 1) showing the cell area along the word line WL thereof.

As shown in FIGS. 2 and 3, a first insulating film (tunnel oxide film) 11, for example, silicon oxide or silicon oxynitride film, a floating gate 12 composed of, for example, a polycrystalline silicon film, a second insulating film (inter-gate insulating film) 13 the composition of which explained in detail below, a control gate 14 composed of, for example, a polycrystalline silicon film and a silicon nitride film 15 are stacked in this order on, for example, a p-type silicon substrate 10. These components form the memory cell MC along with the silicon substrate 10. The control gate 14 can be provided in the upper portion with a silicide layer formed by reacting silicon with tungsten, cobalt, nickel and the like so as to reduce the resistance thereof. Alternatively, the control gate 14 can be formed of silicide layer as a whole, and can also be formed of a metal such as tungsten, titanium, aluminum, or the like.

The floating gates 12 are separated for each of the memory cells MC. The control gates 14 are continuously formed in a direction orthogonal to the bit lines BL, as the word lines WL shared by the multiple memory cells MC, or as the selection gates SGD and SGS shared by the selection gate transistors SG1 and SG2, respectively, all of the word lines WL and the selection gates SGD and SGS being arranged in a direction orthogonal to the bit lines BL.

In the selection gate transistor SG1, an opening is provided to the second insulating film 13. This opening short-circuits the floating gate 12 and the control gate 14 to form a normal transistor. Additionally, in order to obtain sufficient cut-off characteristics at the time of writing, the channel length of the selection gate transistor SG1 is made larger than that of the memory cell MC. The shapes of the components other than those described above are the same as those of the memory cell MC. The selection gate transistor SG2 is of the same shape as that of the selection gate transistor SG1.

An element isolation trench 16 extending in parallel with the bit line BL is formed in the silicon substrate 10 between each adjacent two bit lines BL, each being located in the layer above the silicon substrate 10, in a self-aligning manner with respect to the floating gate 12. An element isolation insulating film (STI (Shallow Trench Isolation)) 17 is formed and embedded in each element isolation trench 16. Thereby, element formation regions 18 are formed and arranged in a stripe pattern separated from each other in the word line WL direction in the layer above the silicon substrate 10. The upper surface of the element isolation insulating film STI is higher than the surface of the semiconductor substrate 10, and lower than the upper surface of the floating gate 12.

As shown in FIG. 3, the second insulating film 13 is continuously formed across the surface of the floating gate 12 and the upper surface of the element isolation insulating film STI. As a result, the contact area between the floating gate 12 and second insulating film 13 is increased. Consequently, an electric field to be applied between the first insulating film 11 and the second insulating film 13 becomes large at the time of writing data. The control gate 14 is formed on the second insulating film 13 to form the word line WL.

As shown in FIGS. 1 and 3, the floating gate 12 and the control gate 14 are short-circuited to each other, thereby forming multiple dummy memory cells MC' not having a function as a memory cell in the bit line BL direction.

A channel area of the memory cell MC is formed in each area facing the floating gate 12 through the first insulating film 11 in the upper layer of the element formation region 18. N-type impurity diffusion regions 19, each of which is to serve as a drain and a source shared by each adjacent two of the memory cells MC, are formed on both sides of each of these channel areas. The impurity diffusion region 19 is formed in the silicon substrate 10 between each adjacent two of the memory cells MC. A memory cell transistor MT is formed of the memory cell MC and the diffusion areas 19 each serving as a source/drain. The memory cell transistors MT are connected to each other in series. In other words, drains/sources of the respective memory cell transistors MT are shared. Further, an impurity diffusion region 19' is formed in the silicon substrate 10 on the opposite side facing the memory cell MC with the selection gate transistor SG1 in between.

The second insulating film 13 not only covers each space between the floating gate 12 and the control gate 14 but also continuously covers each side surface of the floating gate 12 and a side surface to the word line WL of the control gate 14, each upper surface of the silicon nitride film 15 and each upper surface of the silicon substrate 10 between layered products. On this second insulating film 13, an interlayer insulating film 21 composed of such as TEOS (tetraethoxysilane) is formed. In other words, the interlayer insulating film 21 is formed so as to cover the memory cells MC and the selection gate transistors SG1. The bit lines BL are selectively formed on the interlayer insulating film 21. Incidentally, the interlayer insulating film 21 may also be formed of multiple layers.

The second insulating film 13 is used as an inter-gate insulating film, that is, a high voltage resistant insulating film capable of withstanding a writing voltage (about 20V). The formation of the second insulating film 13 on each side surface of the floating gate 12 and the control gate 14 along the word lines WL allows the improvement of the voltage resistance between the word lines WL.

A bit line contact CB is formed on the side opposite to the side of the selection gate transistor SG1 facing the memory cell MC. The bit line contact CB penetrates the interlayer insulating film 21 to electrically connect the bit line BL and the diffusion layer 19'.

Figure 4:
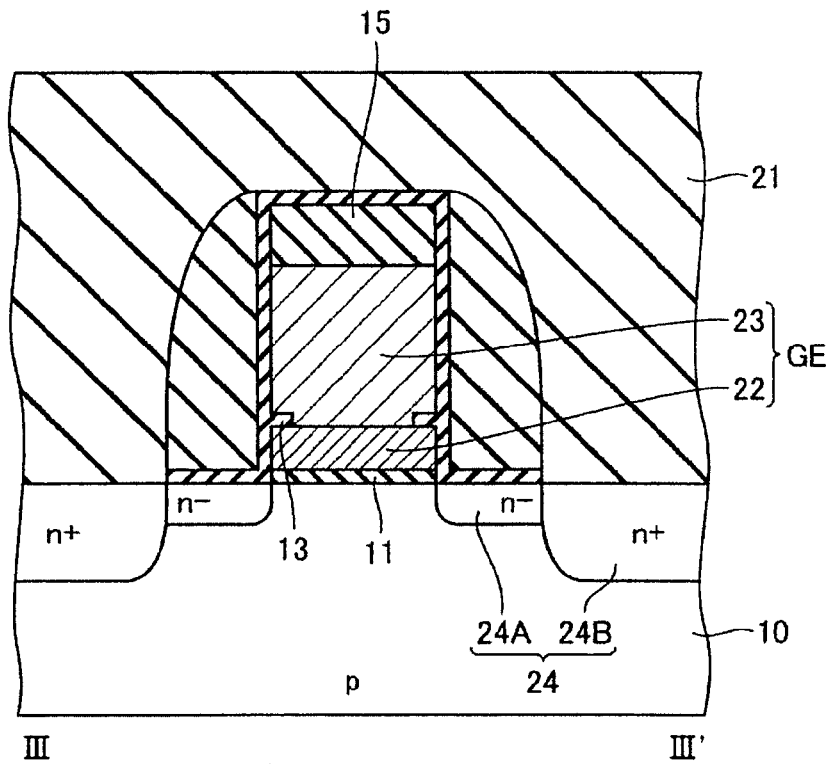
FIG. 4 is a cross-sectional view taken along line III-III' of FIG. 1.
Figure 5A:
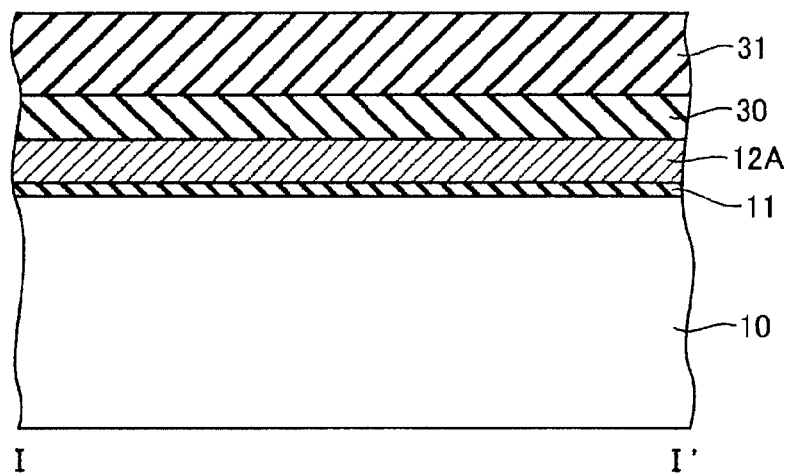
FIG. 5A is a cross-sectional view taken along line I-I' of FIG. 1 showing the NAND type EEPROM in the order of manufacturing processes.
Figure 5B:
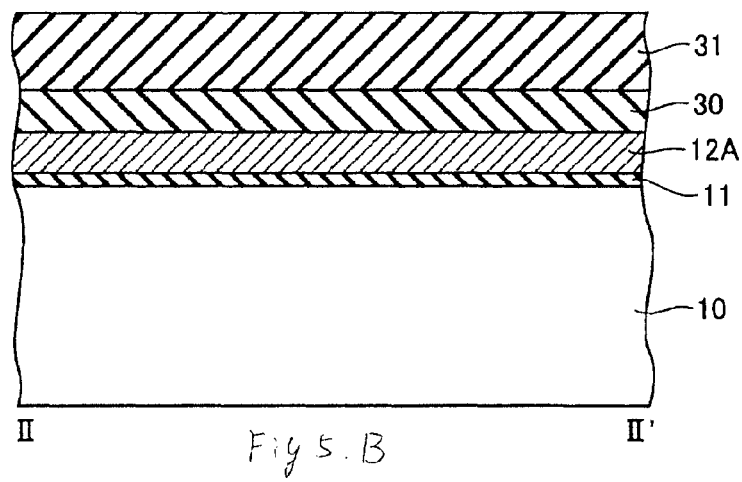
FIG. 5B is a cross-sectional view taken along line II-II' of FIG. 1 showing the NAND type EEPROM in the order of manufacturing processes.
Figure 5C:
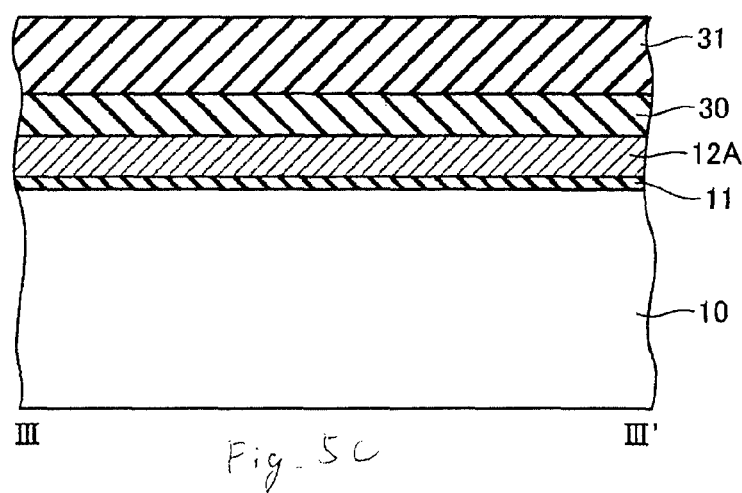
FIG. 5C is a cross-sectional view taken along line III-III' of FIG. 1 showing the NAND type EEPROM in the order of manufacturing processes.
Figure 5D:
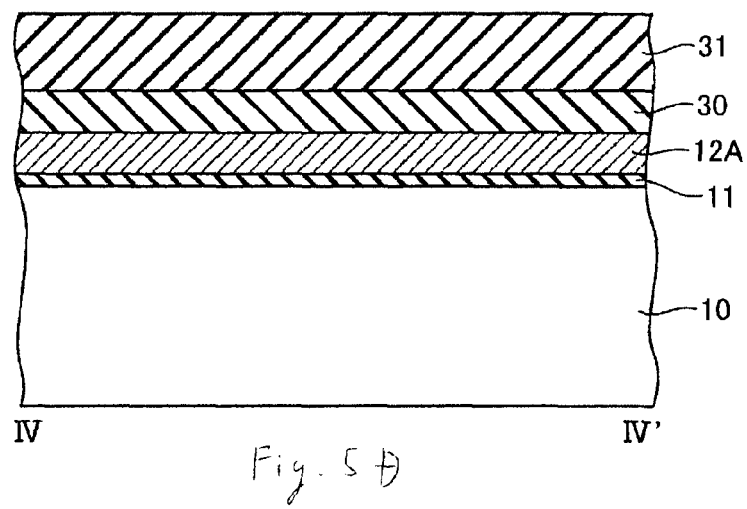
FIG. 5D is a cross-sectional view taken along line IV-IV' of FIG. 1 showing the NAND type EEPROM in the order of manufacturing processes.
Figure 6A:
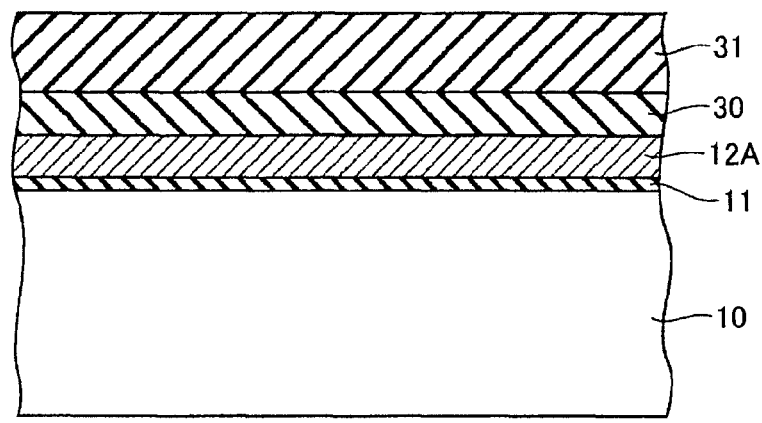
FIG. 6A is a cross-sectional view taken along line I-I' of FIG. 1 showing the NAND type EEPROM in the order of manufacturing processes.
Figure 6B:
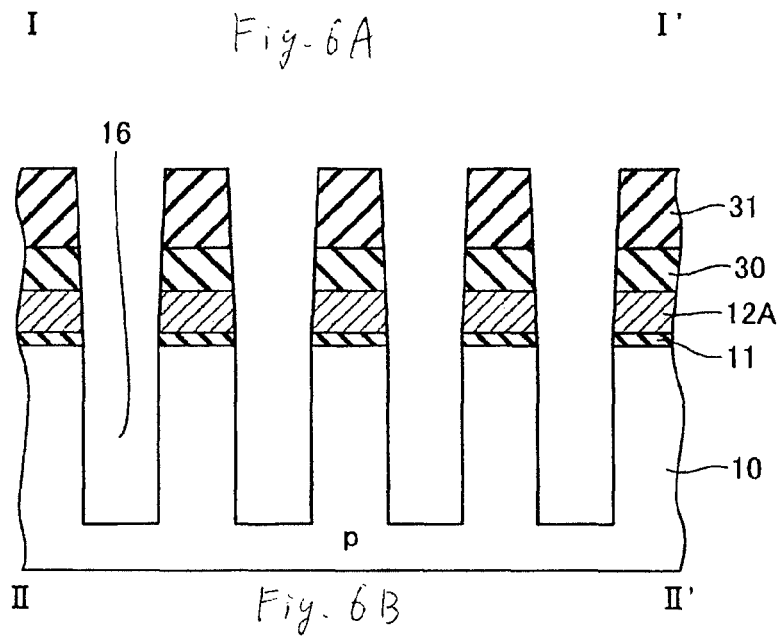
FIG. 6B is a cross-sectional view taken along line II-II' of FIG. 1 showing the NAND type EEPROM in the order of manufacturing processes.
Figure 6C:
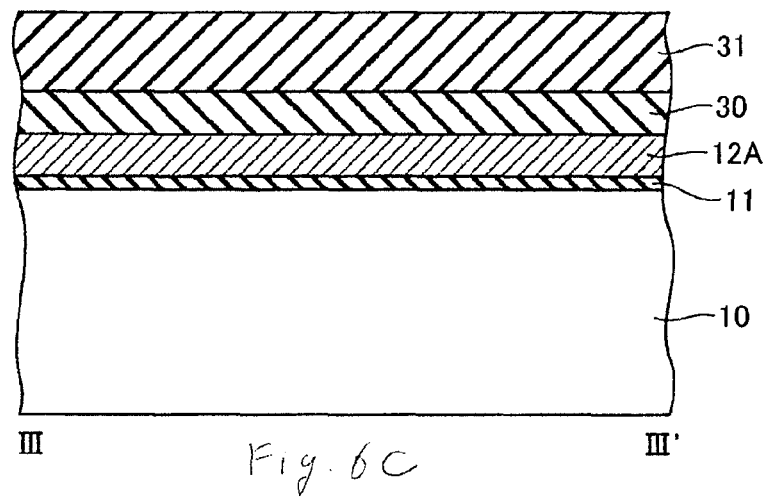
FIG. 6C is a cross-sectional view taken along line III-III' of FIG. 1 showing the NAND type EEPROM in the order of manufacturing processes.
Figure 6D:
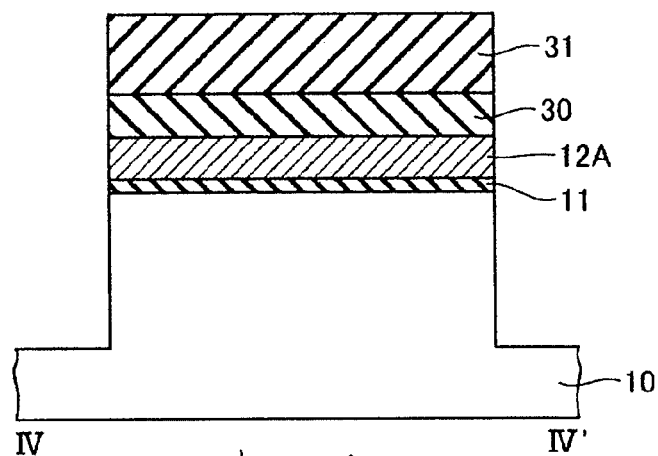
FIG. 6D is a cross-sectional view taken along line IV-IV' of FIG. 1 showing the NAND type EEPROM in the order of manufacturing processes.
Figure 7A:
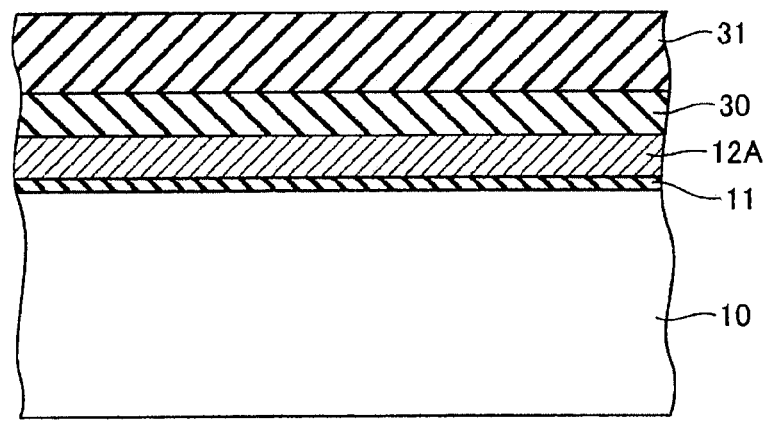
FIG. 7A is a cross-sectional view taken along line I-I' of FIG. 1 showing the NAND type EEPROM in the order of manufacturing processes.
Figure 7B:
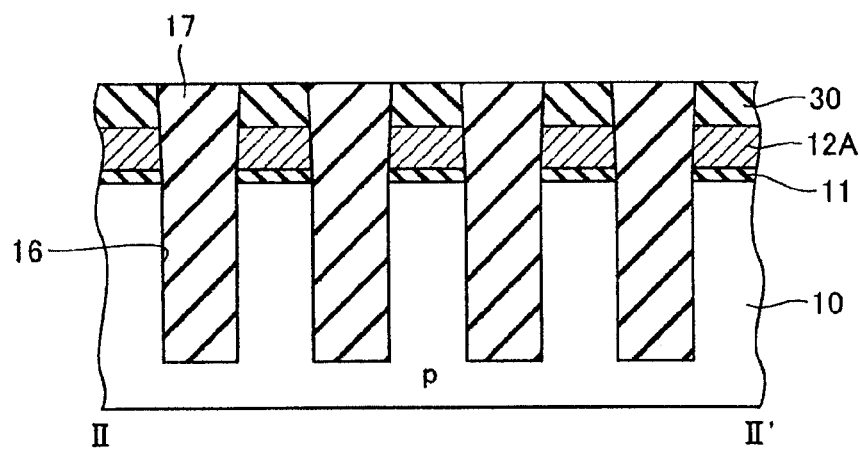
FIG. 7B is a cross-sectional view taken along line II-II' of FIG. 1 showing the NAND type EEPROM in the order of manufacturing processes.
Figure 7C:
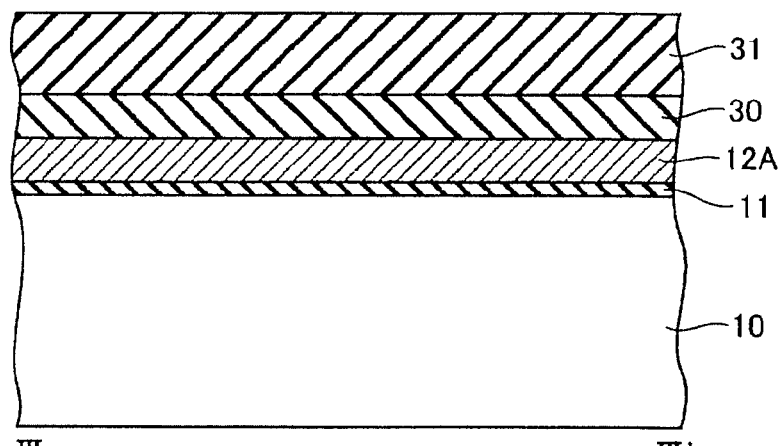
FIG. 7C is a cross-sectional view taken along line III-III' of FIG. 1 showing the NAND type EEPROM in the order of manufacturing processes.
Figure 7D:
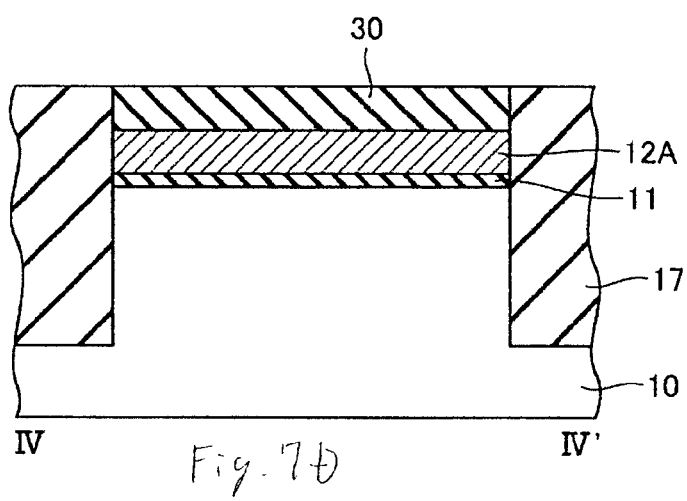
FIG. 7D is a cross-sectional view taken along line IV-IV' of FIG. 1 showing the NAND type EEPROM in the order of manufacturing processes.

As shown in FIG. 1, an element region surrounded by the element isolation insulating film is formed in the peripheral circuit transistor area PA. A gate electrode GE extending in parallel to the word line WL of the cell area CA and penetrating the element region is formed. A gate contact is formed on the element isolation insulating film of the gate electrode GE, and connected to the wiring (not shown) in the upper layer. Note that, the direction in which the gate electrode GE extends is not limited to the direction parallel to the word line WL. FIG. 4 is a cross-sectional view showing the peripheral circuit transistor area PA viewed along the direction orthogonal to the gate electrode GE (cross-sectional view taken along line III-III' of FIG. 1).

As shown in FIG. 4, for example, a lower gate 22 composed of a polycrystalline silicon film, a second insulating film (inter-gate insulating film) 13, an upper gate 23 composed of a polycrystalline silicon film, and a silicon nitride film 15 are stacked in this order through a first insulating film 11 (gate oxide film, tunnel oxide film) to form the gate electrode GE on a p-type silicon substrate 10 in the peripheral circuit transistor area PA. The lower gate 22 and the upper gate 23 are formed through the same process as that of the floating gate 12 and the control gate 14 of the memory cell MC as described below. The second insulating film 13 is removed in part, so that the gate electrode GE is of a structure in which the lower gate 22 and the upper gate 23 are short-circuited to each other. The second insulating film 13 is also continuously formed on the side surfaces of the lower and the upper gate electrodes.

A channel area is formed on the surface layer of the silicon substrate 10 facing the gate electrode GE in the peripheral circuit transistor area PA. For example, an n-type impurity diffusion region 24 serving as a drain and a source is formed on both sides of the channel area. The impurity diffusion region 24 is of a so-called LLD structure composed of an extension section 24A and a high concentration impurity diffusion region 24B in which a contact connected to the wiring in the upper layer is formed. A MOS transistor is formed of the gate electrode GE, the impurity diffusion region 24, and the first insulating film 11.

Referring to FIGS. 5 to 21, a method for manufacturing the NAND type EEPROM according to the above-described first embodiment will then be described. FIGS. 5A to 21A are cross-sectional views each taken along line I-I' of FIG. 1; FIGS. 5B to 21B, taken along line II-II' of FIG. 1; FIGS. 5C to 21C, taken along line III-III' of FIG. 1; and FIGS. 5D to 21D, taken along line IV-IV' of FIG. 1.

As shown in FIGS. 5A to 5D, the first insulating film 11 is formed with a thickness of, for example, 10 nm on the silicon substrate 10. Then, a first polycrystalline silicon film 12A serving as the floating gate 12 and the lower gate 22 is formed with a thickness of, for example, 100 nm on the first insulating film 11. Furthermore, a silicon nitride film 30 is formed thereon with a thickness of, for example, 70 nm. Then, a resist film 31 is formed on the silicon nitride film 30. The resist film 31 is patterned as shown in FIGS. 6A to 6D. Then, the silicon nitride film 30, the first polycrystalline silicon film 12A, the first insulating film 11 and the top layer of the silicon substrate 10 are selectively removed by an anisotropic etching method to form the element isolation trench 16 extending into the silicon substrate 10.

A resist film 31 is removed as shown in FIGS. 7A to 7D. Then, the element isolation insulating film 17 such as STI-TEOS film is formed in the trenches as the first embedded film. Subsequently, the upper surface of the element isolation insulating film 17 is planarized using the silicon nitride film 30 as a stopper by a CMP (chemical mechanical polishing) method.

Figure 8A:
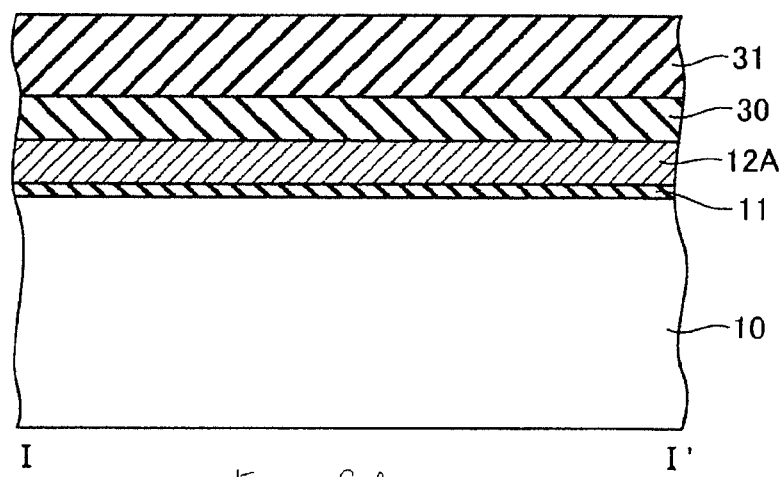
FIG. 8A is a cross-sectional view taken along line I-I' of FIG. 1 showing the NAND type EEPROM in the order of manufacturing processes.
Figure 8B:
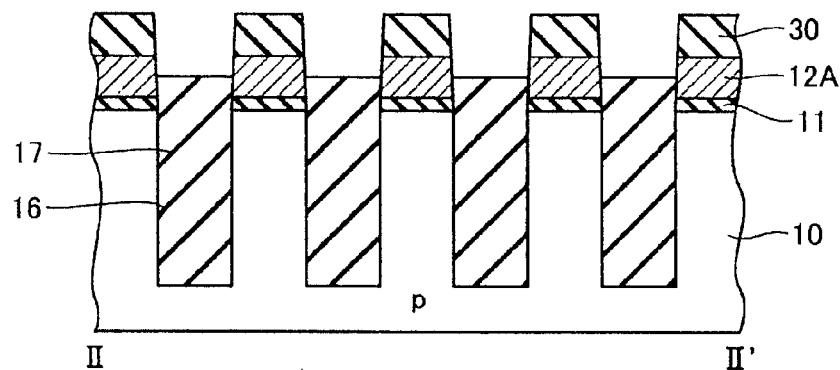
FIG. 8B is a cross-sectional view taken along line II-II' of FIG. 1 showing the NAND type EEPROM in the order of manufacturing processes.
Figure 8C:
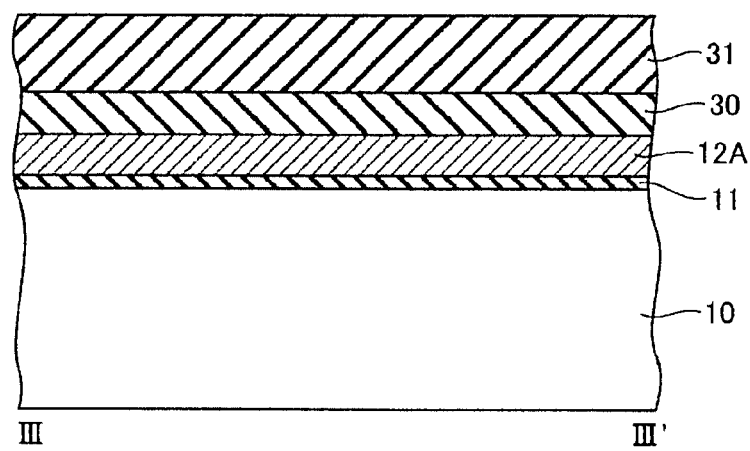
FIG. 8C is a cross-sectional view taken along line III-III' of FIG. 1 showing the NAND type EEPROM in the order of manufacturing processes.
Figure 8D:
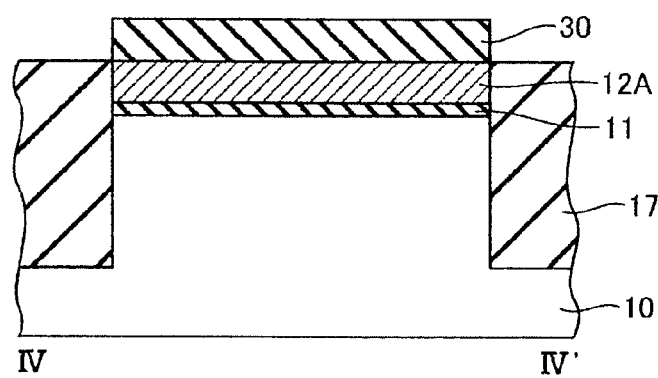
FIG. 8D is a cross-sectional view taken along line IV-IV' of FIG. 1 showing the NAND type EEPROM in the order of manufacturing processes.
Figure 9A:
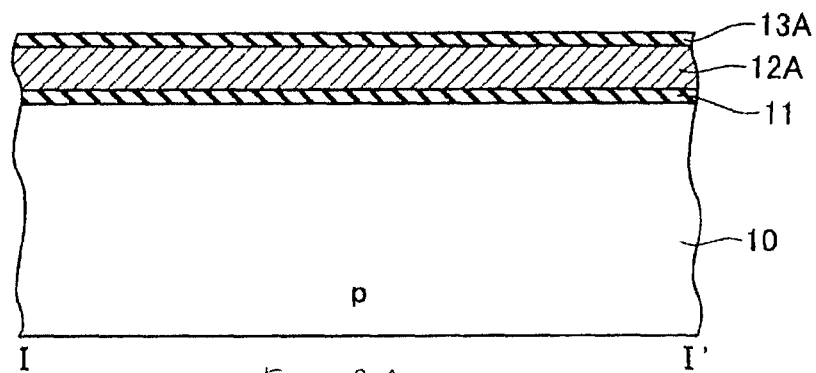
FIG. 9A is a cross-sectional view taken along line I-I' of FIG. 1 showing the NAND type EEPROM in the order of manufacturing processes.
Figure 9B:
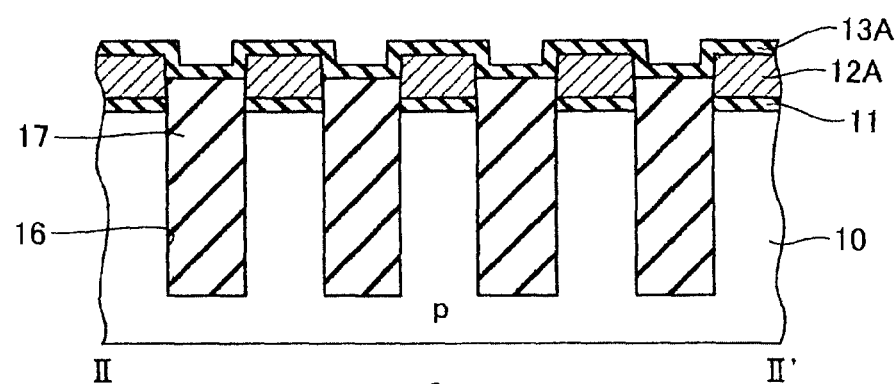
FIG. 9B is a cross-sectional view taken along line II-II' of FIG. 1 showing the NAND type EEPROM in the order of manufacturing processes.
Figure 9C:
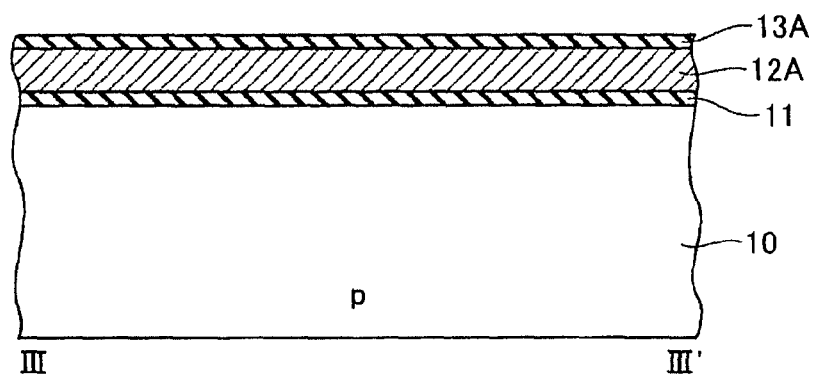
FIG. 9C is a cross-sectional view taken along line III-III' of FIG. 1 showing the NAND type EEPROM in the order of manufacturing processes.
Figure 9D:
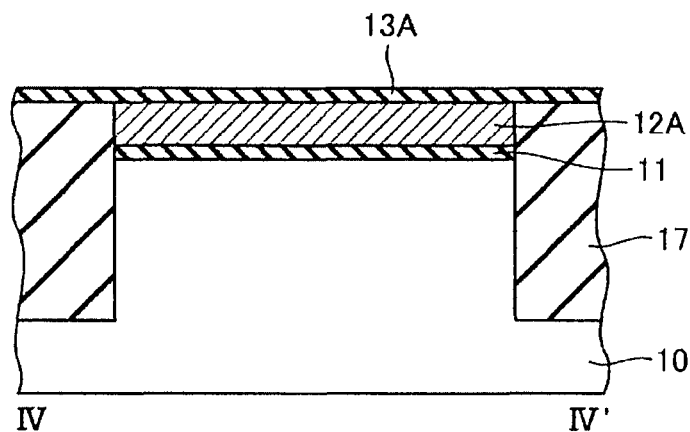
FIG. 9D is a cross-sectional view taken along line IV-IV' of FIG. 1 showing the NAND type EEPROM in the order of manufacturing processes.
Figure 10A:
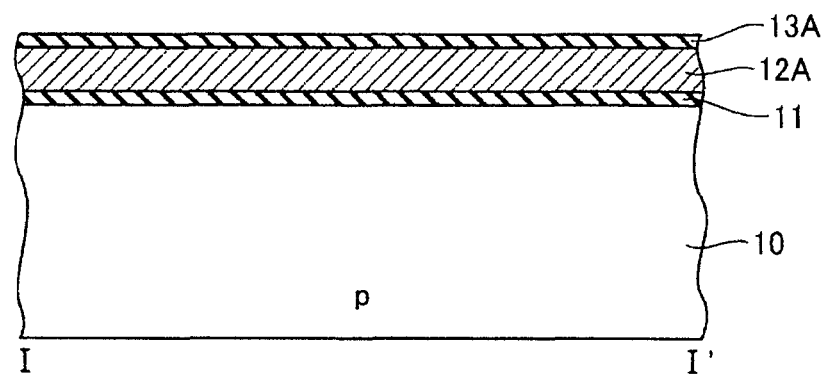
FIG. 10A is a cross-sectional view taken along line I-I' of FIG. 1 showing the NAND type EEPROM in the order of manufacturing processes.
Figure 10B:
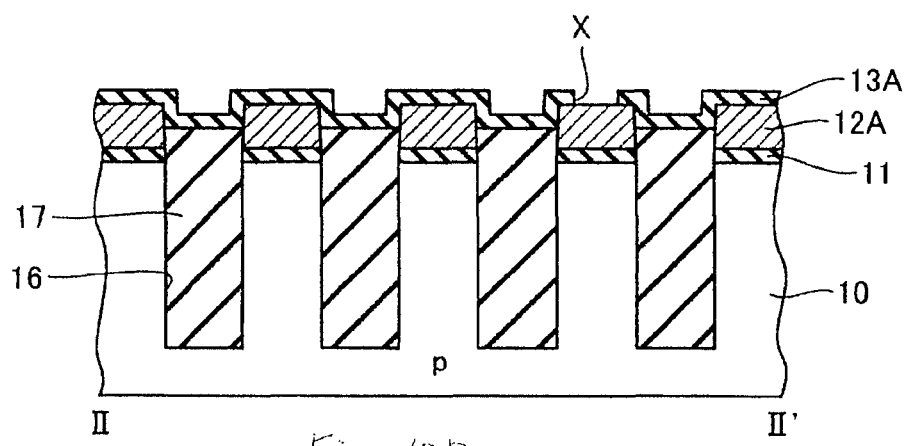
FIG. 10B is a cross-sectional view taken along line II-II' of FIG. 1 showing the NAND type EEPROM in the order of manufacturing processes.
Figure 10C:
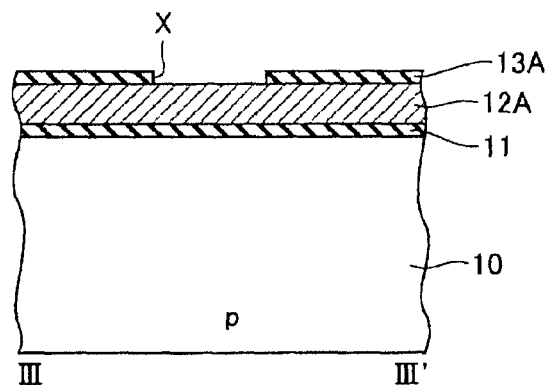
FIG. 10C is a cross-sectional view taken along line III-III' of FIG. 1 showing the NAND type EEPROM in the order of manufacturing processes.
Figure 10D:
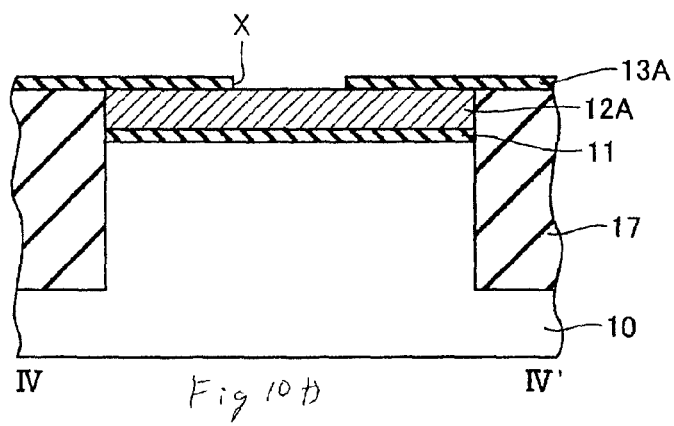
FIG. 10D is a cross-sectional view taken along line IV-IV' of FIG. 1 showing the NAND type EEPROM in the order of manufacturing processes.
Figure 11A:
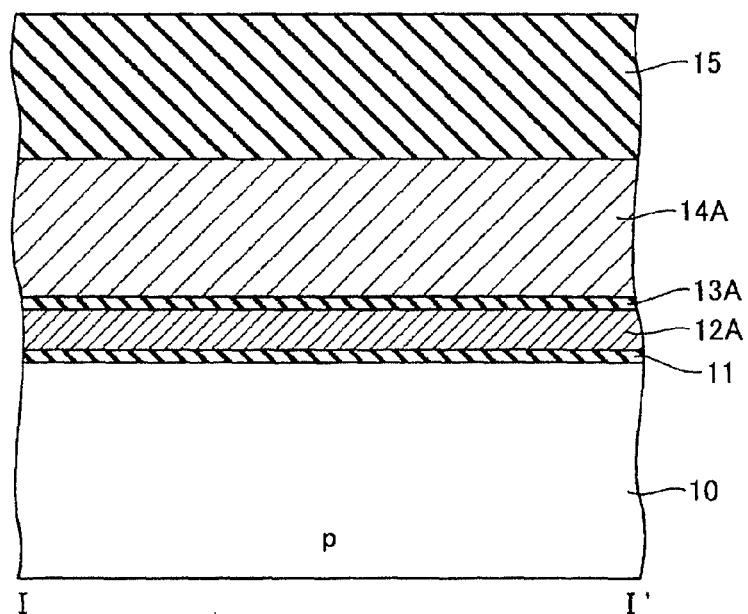
FIG. 11A is a cross-sectional view taken along line I-I' of FIG. 1 showing the NAND type EEPROM in the order of manufacturing processes.
Figure 11B:
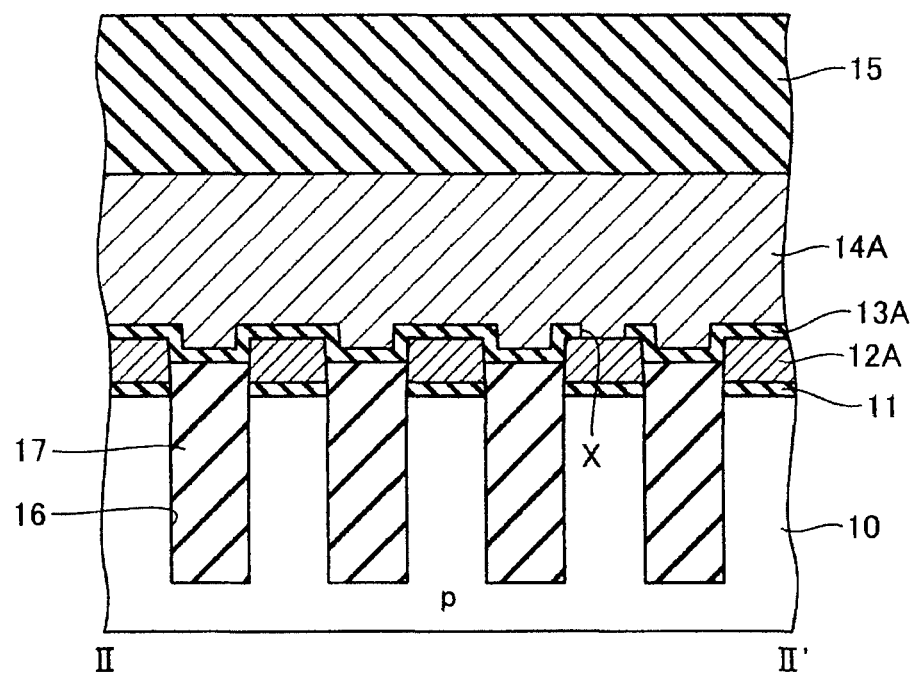
FIG. 11B is a cross-sectional view taken along line II-II' of FIG. 1 showing the NAND type EEPROM in the order of manufacturing processes.
Figure 11C:
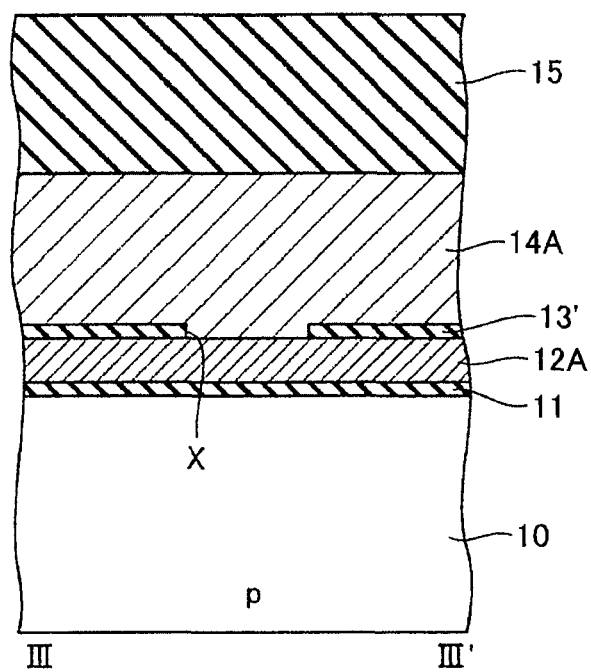
FIG. 11C is a cross-sectional view taken along line III-III' of FIG. 1 showing the NAND type EEPROM in the order of manufacturing processes.
Figure 11D:
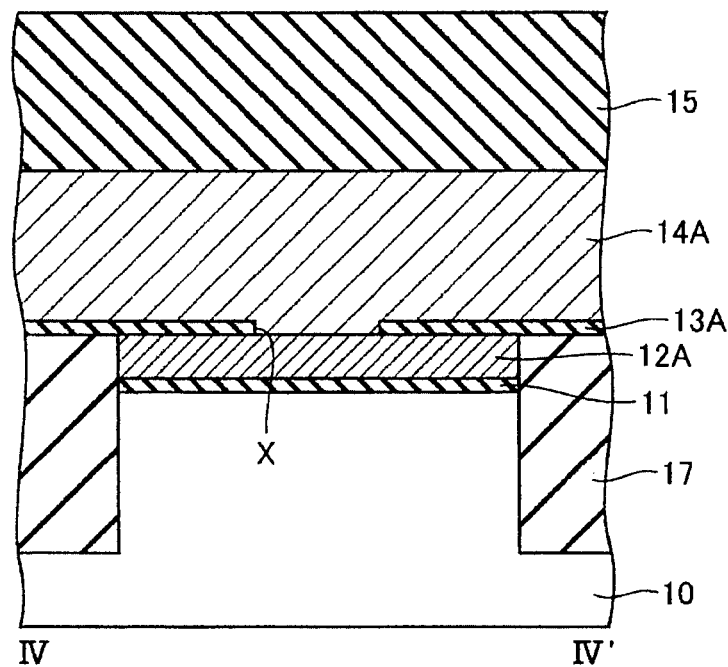
FIG. 11D is a cross-sectional view taken along line IV-IV' of FIG. 1 showing the NAND type EEPROM in the order of manufacturing processes.
Figure 12A:
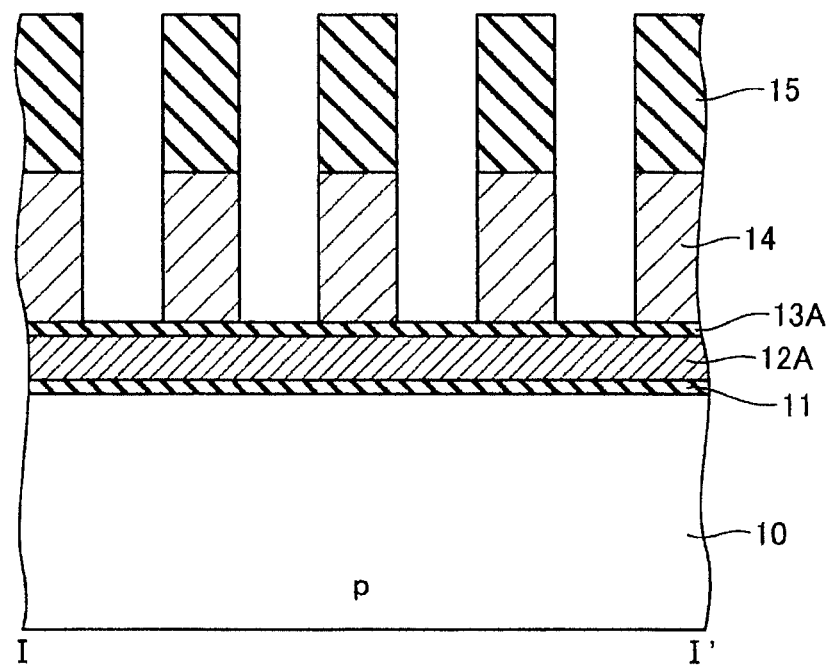
FIG. 12A is a cross-sectional view taken along line I-I' of FIG. 1 showing the NAND type EEPROM in the order of manufacturing processes.
Figure 12B:
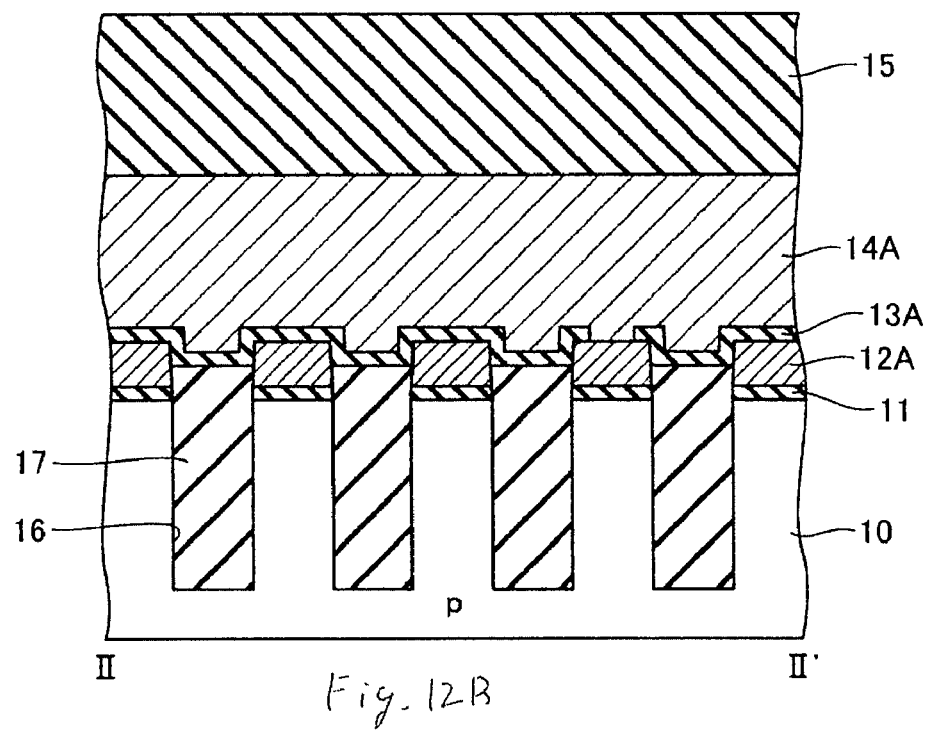
FIG. 12B is a cross-sectional view taken along line II-II' of FIG. 1 showing the NAND type EEPROM in the order of manufacturing processes.
Figure 12C:
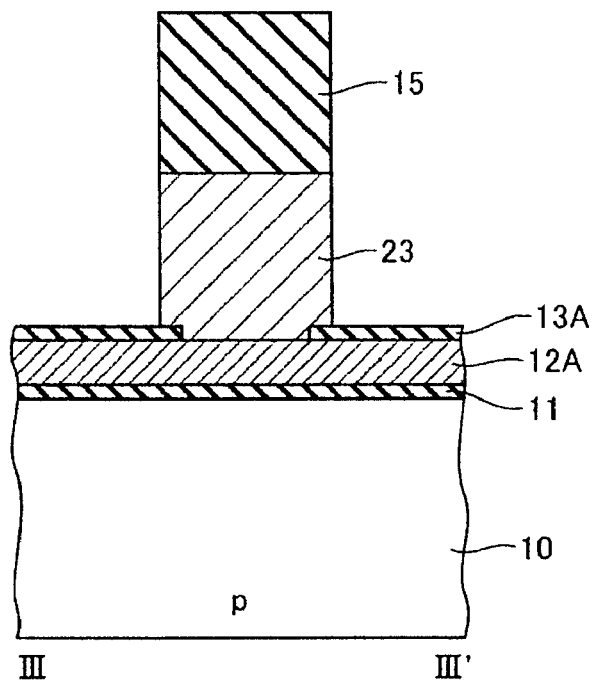
FIG. 12C is a cross-sectional view taken along line III-III' of FIG. 1 showing the NAND type EEPROM in the order of manufacturing processes.
Figure 12B:
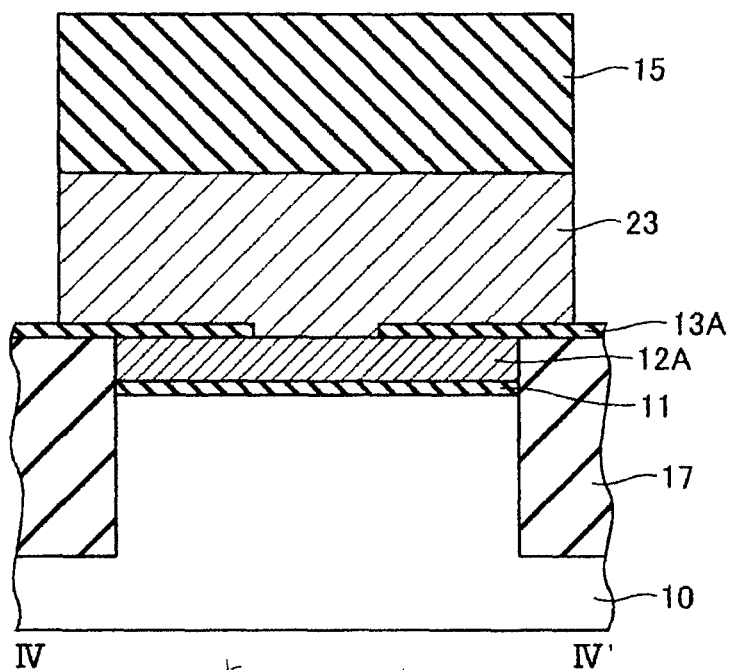
Figure 13A:
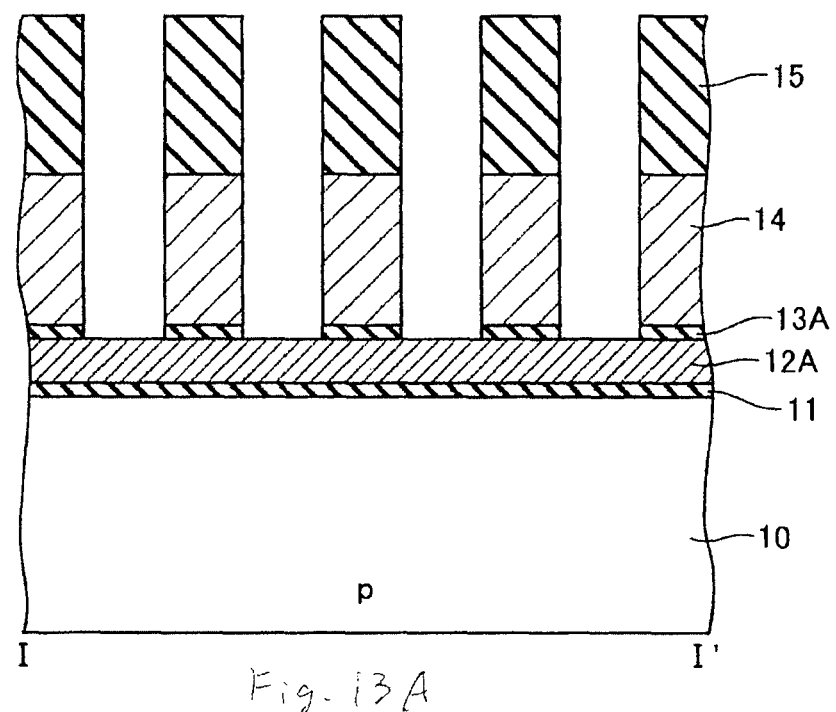
FIG. 13A is a cross-sectional view taken along line I-I' of FIG. 1 showing the NAND type EEPROM in the order of manufacturing processes.
Figure 13B:
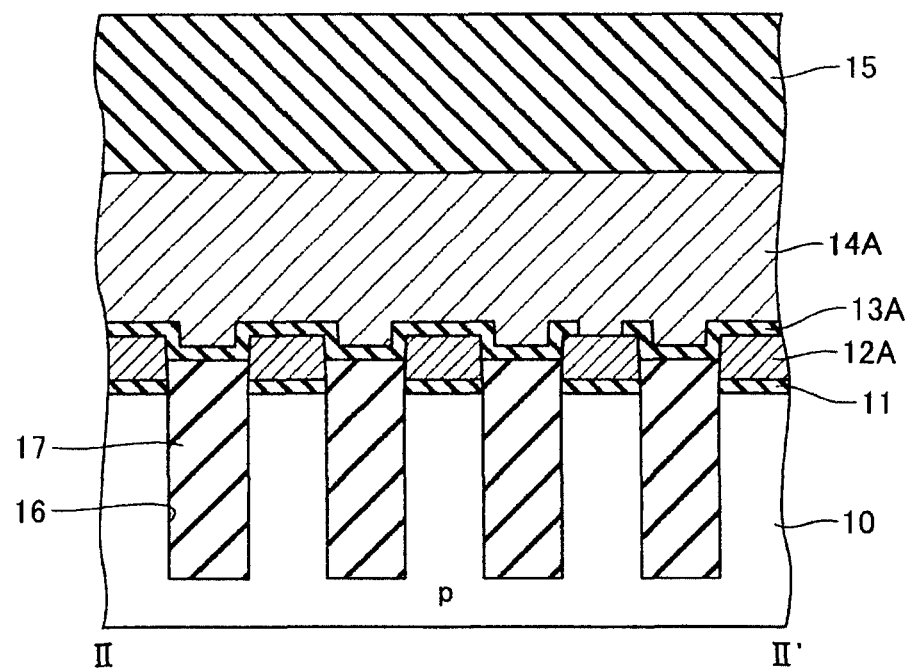
FIG. 13B is a cross-sectional view taken along line II-II' of FIG. 1 showing the NAND type EEPROM in the order of manufacturing processes.
Figure 13C:
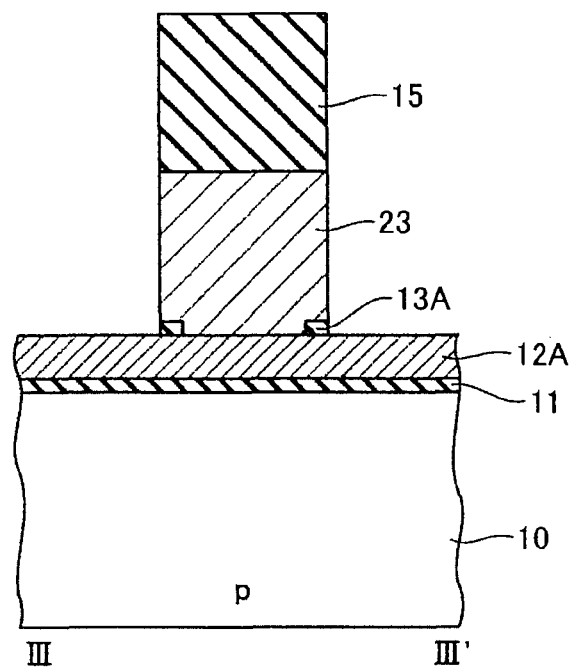
FIG. 13C is a cross-sectional view taken along line III-III' of FIG. 1 showing the NAND type EEPROM in the order of manufacturing processes.
Figure 13A:
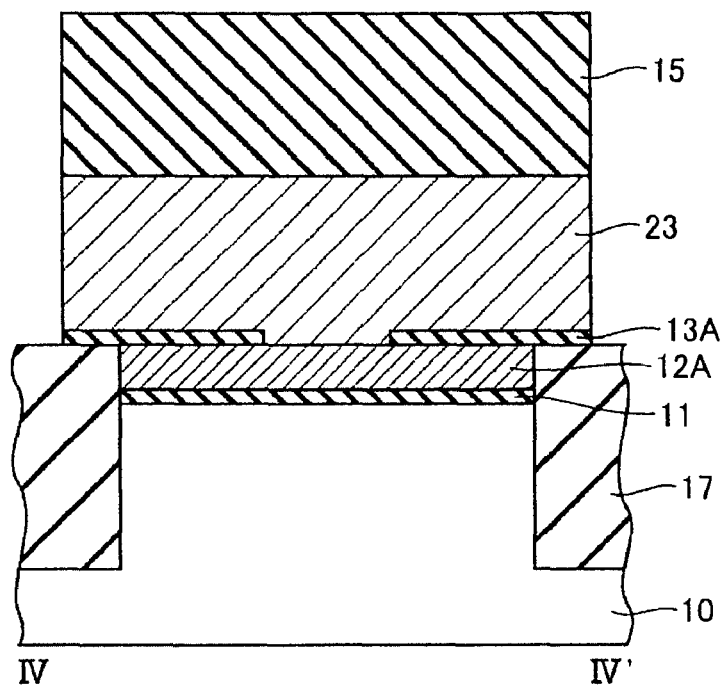
Figure 14A:
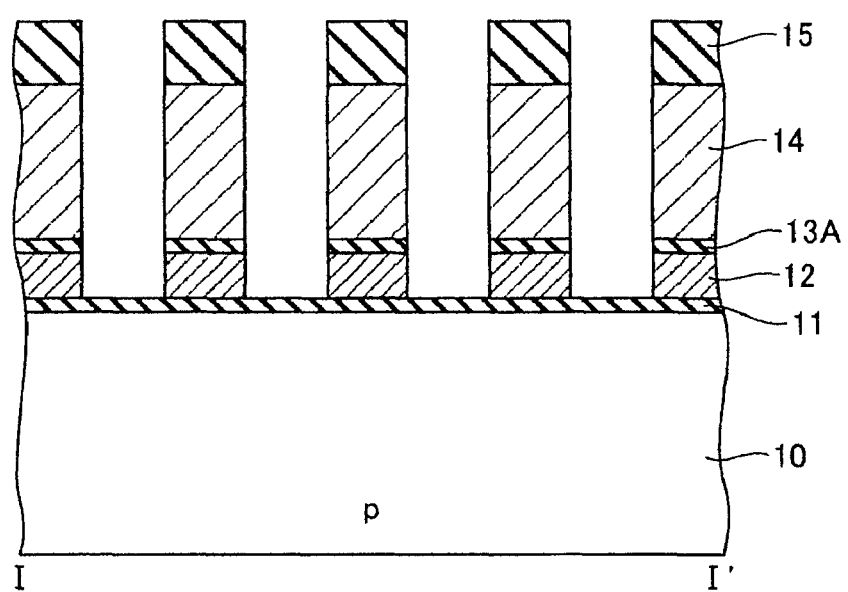
FIG. 14A is a cross-sectional view taken along line I-I' of FIG. 1 showing the NAND type EEPROM in the order of manufacturing processes.
Figure 14B:
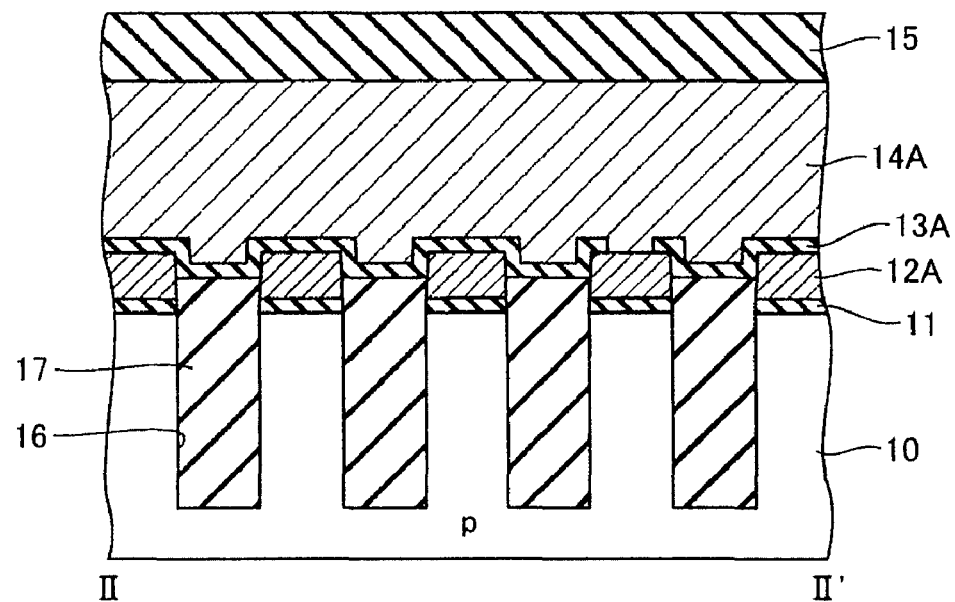
FIG. 14B is a cross-sectional view taken along line II-II' of FIG. 1 showing the NAND type EEPROM in the order of manufacturing processes.
Figure 14C:
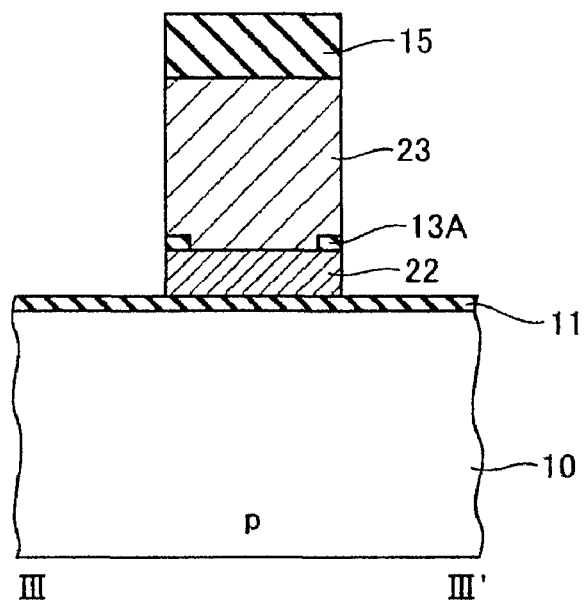
FIG. 14C is a cross-sectional view taken along line III-III' of FIG. 1 showing the NAND type EEPROM in the order of manufacturing processes.
Figure 14B:
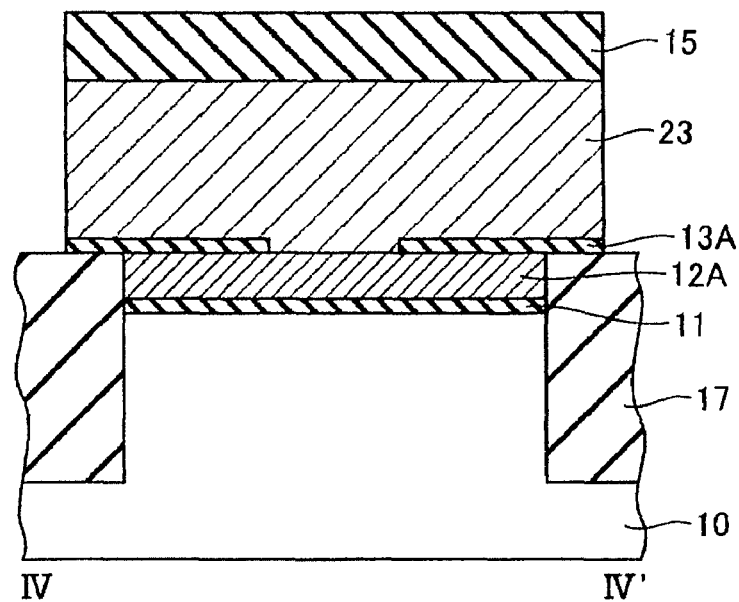
Figure 15A:
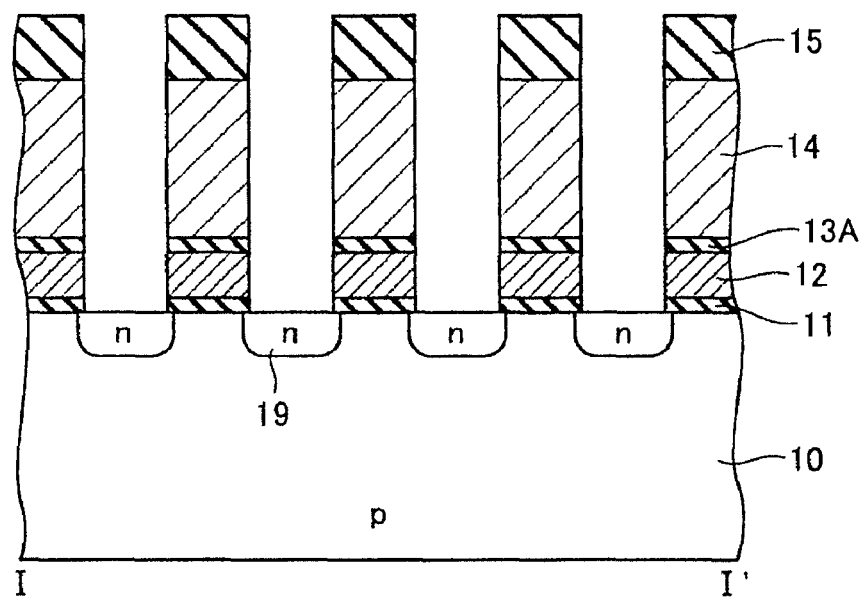
FIG. 15A is a cross-sectional view taken along line I-I' of FIG. 1 showing the NAND type EEPROM in the order of manufacturing processes.
Figure 15B:
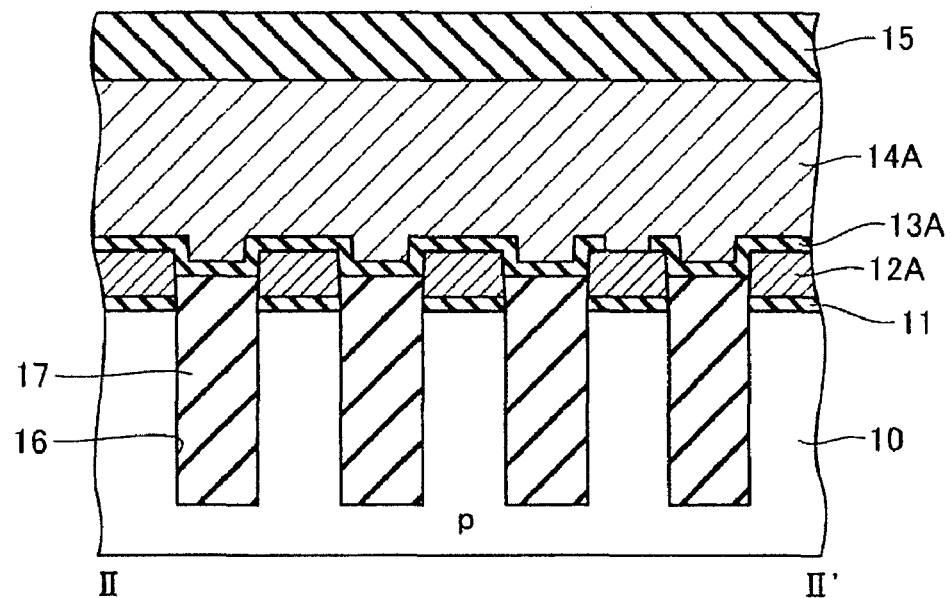
FIG. 15B is a cross-sectional view taken along line II-II' of FIG. 1 showing the NAND type EEPROM in the order of manufacturing processes.
Figure 15C:
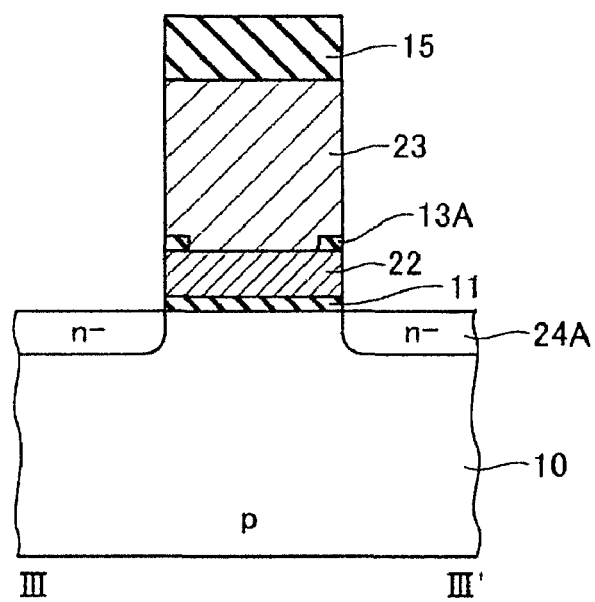
FIG. 15C is a cross-sectional view taken along line III-III' of FIG. 1 showing the NAND type EEPROM in the order of manufacturing processes.
Figure 15:
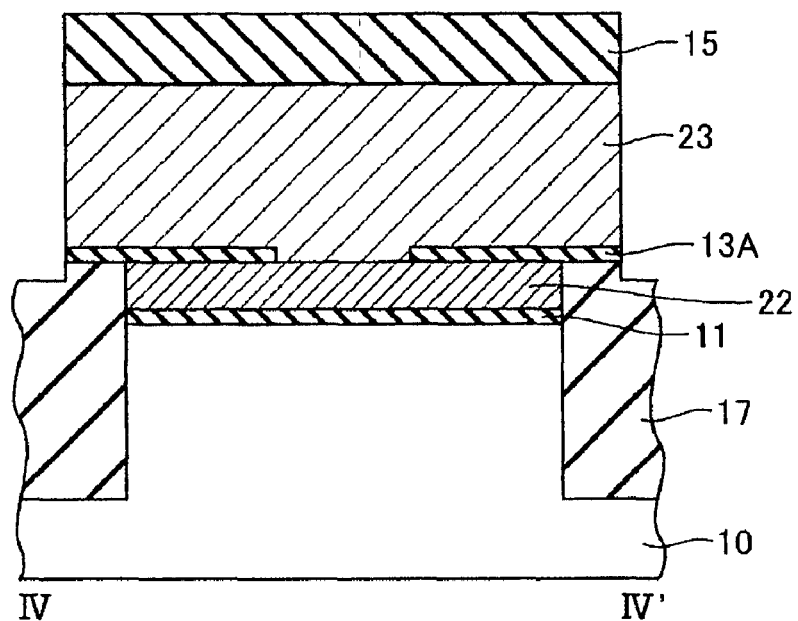
FIG. 15D is a cross-sectional view taken along line IV-IV' of FIG. 1 showing the NAND type EEPROM in the order of manufacturing processes.
Figure 16A:
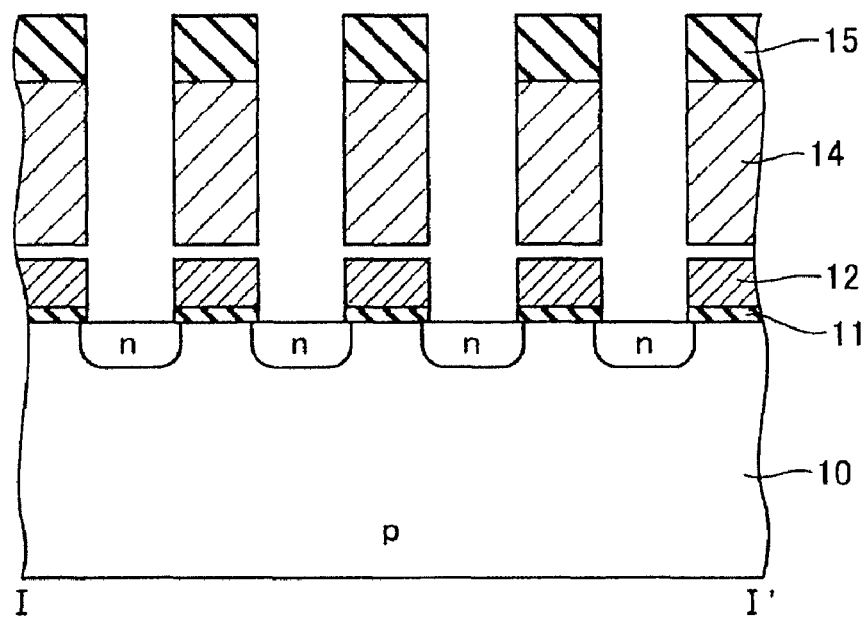
FIG. 16A is a cross-sectional view taken along line I-I' of FIG. 1 showing the NAND type EEPROM in the order of manufacturing processes.
Figure 16B:
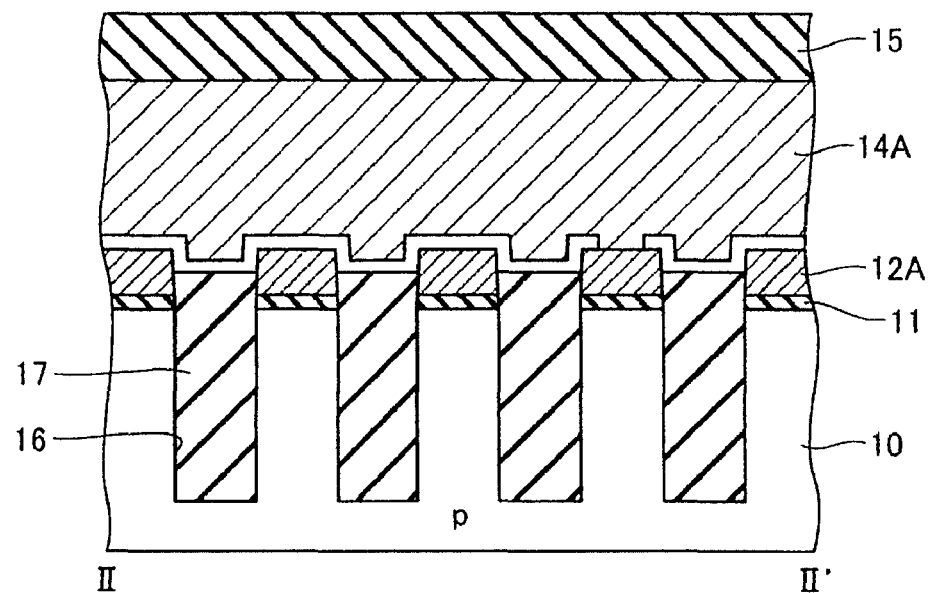
FIG. 16B is a cross-sectional view taken along line II-II' of FIG. 1 showing the NAND type EEPROM in the order of manufacturing processes.
Figure 16C:
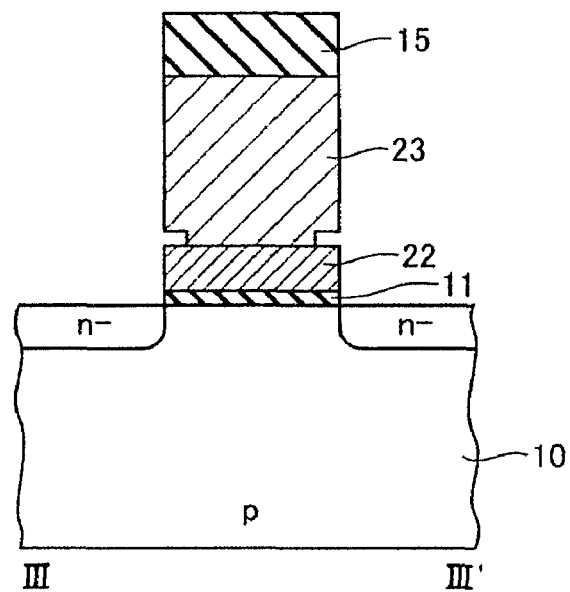
FIG. 16C is a cross-sectional view taken along line III-III' of FIG. 1 showing the NAND type EEPROM in the order of manufacturing processes.
Figure 16B:
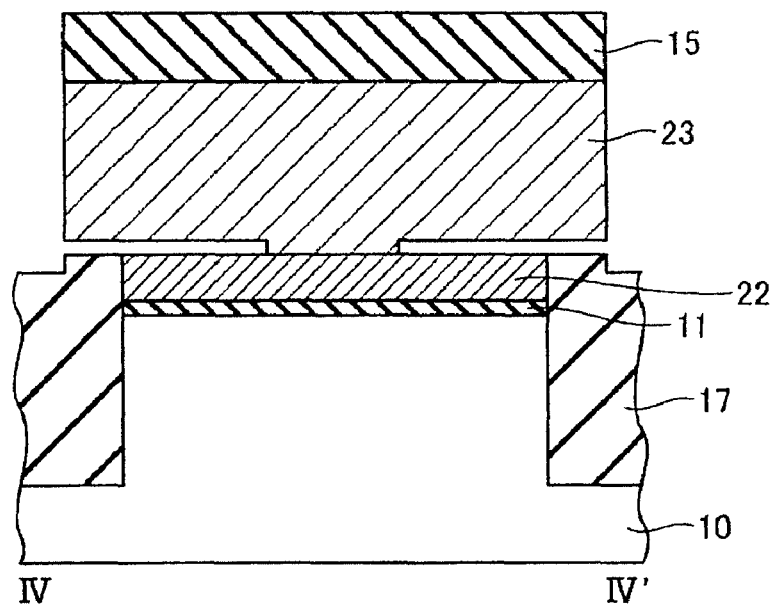

As shown in FIG. 8A to 8D, the upper surface of the element isolation insulating film 17 is lowered to the level of the upper surface of the first polycrystalline silicon film 12A by a wet etching method using DHF (Dilute Hydrofluoric acid) or an RIE (Reactive Ion Etching) method using the silicon nitride film 30 as a mask. Thereafter, the upper surface of the element isolation insulating film 17 adjacent to the memory cell MC is lowered to the level lower than that of the upper surface of the first polycrystalline silicon film 12A and higher than that of the surface of the silicon substrate 10 (FIG. 8B).

As shown in FIGS. 9A to 9D, the silicon nitride film 30 is removed, and a native oxide film on the first polycrystalline silicon film 12A is removed by a wet etching method. Subsequently, a pseudo silicon nitride film 13A which has a high etch selectivity to the materials of floating gate 12, the control gate 14 and a first insulating film 11, is formed on the exposed surfaces of the first polycrystalline silicon film 12A. Film 13A may cover the entire surface of film 12A.

As shown in FIGS. 10A to 10D, a pattern (not shown) for opening portions of a selection gate transistor area of a cell array, a peripheral circuit transistor area, and a dummy line area of the pseudo silicon nitride film 13A is formed. The pseudo silicon nitride film 13A is removed by an etching method using this pattern as a mask. Consequently, openings X exposing the first polycrystalline silicon film 12A are formed. Alternatively, these processes can be performed at the same time to omit the number of processes.

As shown in FIGS. 11A to 11D, a second polycrystalline silicon film 14A which is to serve as the control gate 14 and the upper gate 23 is formed with a thickness of, for example, 160 nm on the pseudo silicon nitride film 13A and in the openings X. Thereafter, the silicon nitride film 15 is formed thereon with a thickness of, for example, about 200 nm.

Consequently, the first polycrystalline silicon film 12A and second polycrystalline silicon film 14A of the selection gate transistor, the peripheral circuit transistor and the dummy memory cell are electrically connected to each other through the openings X.

In some cases, a native oxide film is formed on the surface of the first polycrystalline silicon film 12A exposed through the openings X. In such cases, the native oxide film may be removed using a fluorinated acid solution prior to the formation of the second polycrystalline silicon film 14A. Thereby, the first polycrystalline silicon film 12A and the second polycrystalline silicon film 14A can be securely conducted to each other.

As shown in FIGS. 12A to 12D, for example, a resist film (not shown) is formed on the silicon nitride film 15, and the resist film thus formed is then subject to patterning. Thereafter, the silicon nitride film 15 and the second polycrystalline silicon film 14A are selectively removed by an anisotropic etching method to form the control gate 14 and the upper gate 23. In this process, the use of the pseudo silicon nitride film 13A as an etching stopper film allows preventing conduction failure between adjacent memory cells due to the residual second polycrystalline silicon film 14A.

As shown in FIGS. 13A to 13D, the resist is removed, and the pseudo silicon nitride film 13A is selectively removed by an anisotropic etching method using the silicon nitride film 15 as a mask. Prior to the process of removing the pseudo silicon nitride film 13A, the resist film may be removed in some cases on the silicon nitride film 15 and the second polycrystalline silicon film 14A.

As shown in FIGS. 14A to 14D, the first polycrystalline silicon film 12A is selectively removed by an anisotropic etching method using the silicon nitride film 15 as a mask, and divided in the bit line BL direction thereby to form the floating gate 12 and the lower gate 22.

As shown in FIGS. 15A to 15D, the first insulating film 11 is further selectively removed by an anisotropic etching method using the silicon nitride film 15 as a mask. Then, ions are selectively implanted into the silicon substrate 10 to form the impurity diffusion regions 19 and 24A.

As shown in FIGS. 16A to 16D, the pseudo silicon nitride film 13A is removed by an etching method using a removing agent such as phosphoric acid ($H_3PO_4$). Consequently, the pseudo silicon nitride film 13A formed between the first polycrystalline silicon film 12A and the second polycrystalline silicon film 14A is removed. In this process, a dummy memory cell MC' supports the control gate 14 extending in the word line WL direction by short-circuiting the floating gate 12 and the control gate 14, so that the control gate 14 would not fall on the floating gate 12 due to its own weight. For this reason, air gaps are formed in each portion, between the first polycrystalline silicon film 12A and the second polycrystalline silicon film 14A, in which the pseudo silicon nitride film 13A was formed.

Figure 17A:
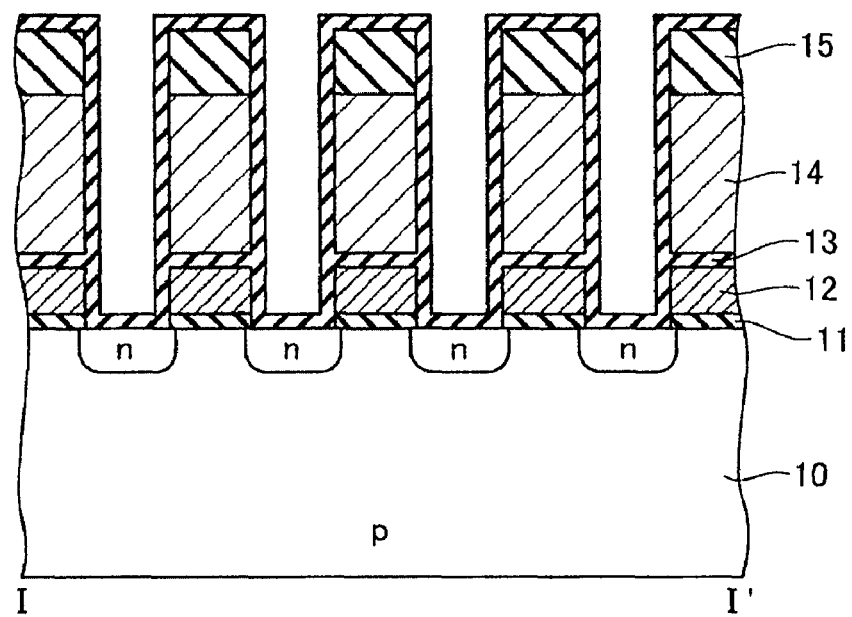
FIG. 17A is a cross-sectional view taken along line I-I' of FIG. 1 showing the NAND type EEPROM in the order of manufacturing processes.
Figure 17B:
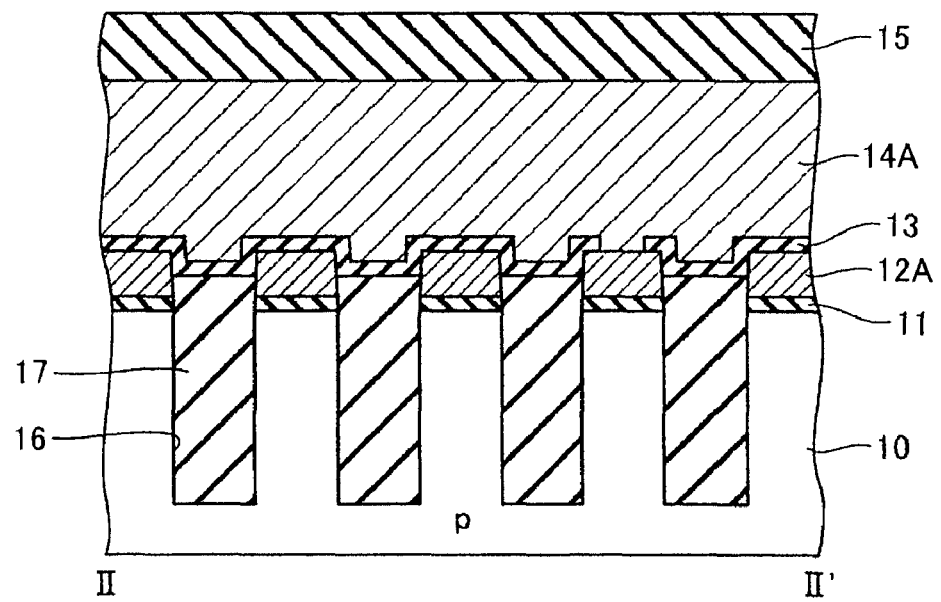
FIG. 17B is a cross-sectional view taken along line II-II' of FIG. 1 showing the NAND type EEPROM in the order of manufacturing processes.
Figure 17C:
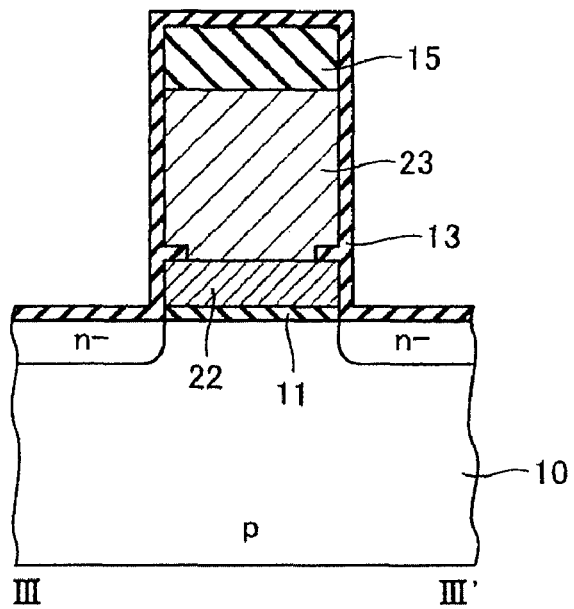
FIG. 17C is a cross-sectional view taken along line III-III' of FIG. 1 showing the NAND type EEPROM in the order of manufacturing processes.
Figure 17D:
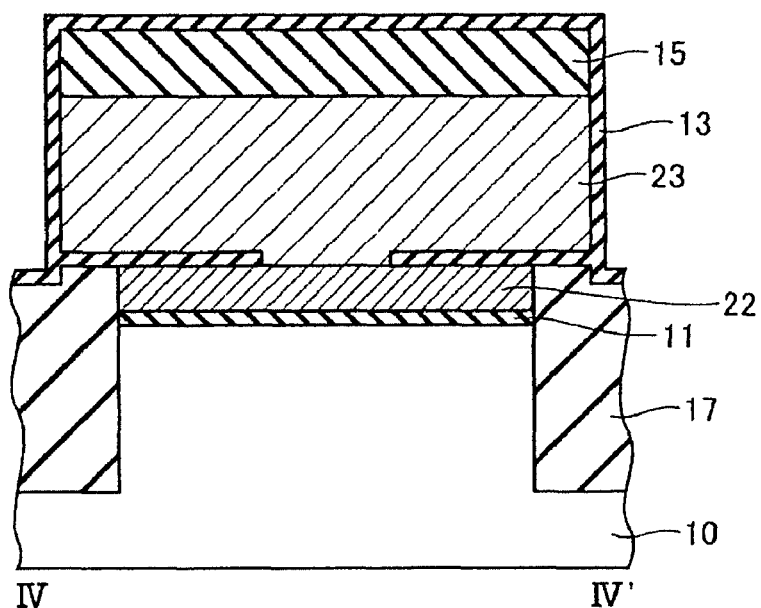
FIG. 17D is a cross-sectional view taken along line IV-IV' of FIG. 1 showing the NAND type EEPROM in the order of manufacturing processes.
Figure 18A:
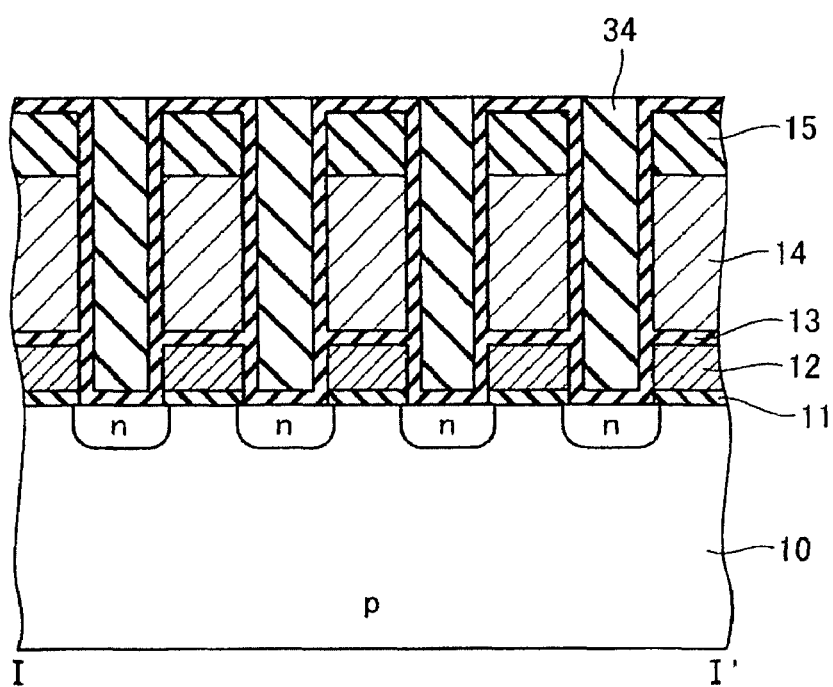
FIG. 18A is a cross-sectional view taken along line I-I' of FIG. 1 showing the NAND type EEPROM in the order of manufacturing processes.
Figure 18B:
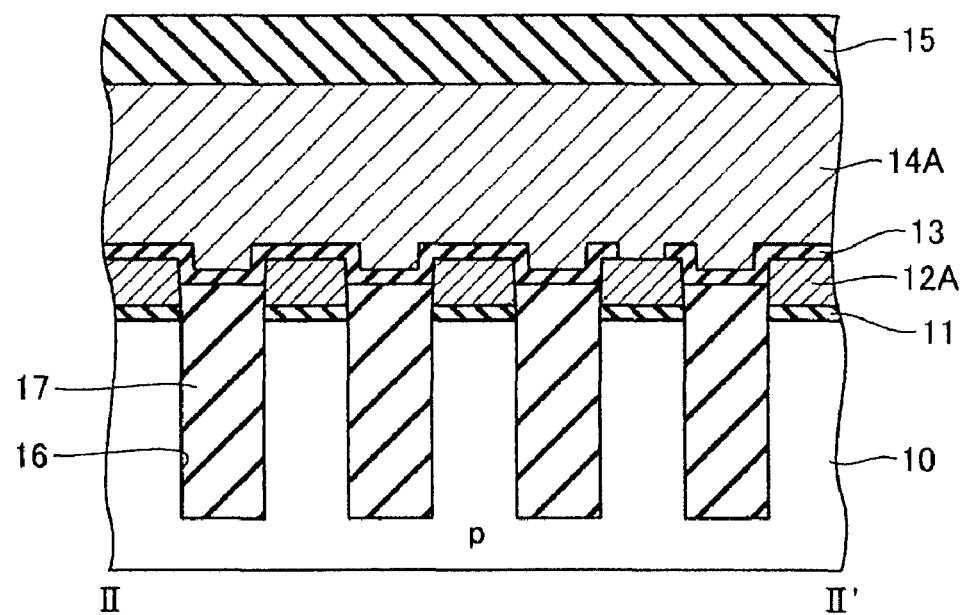
FIG. 18B is a cross-sectional view taken along line II-II' of FIG. 1 showing the NAND type EEPROM in the order of manufacturing processes.
Figure 18C:
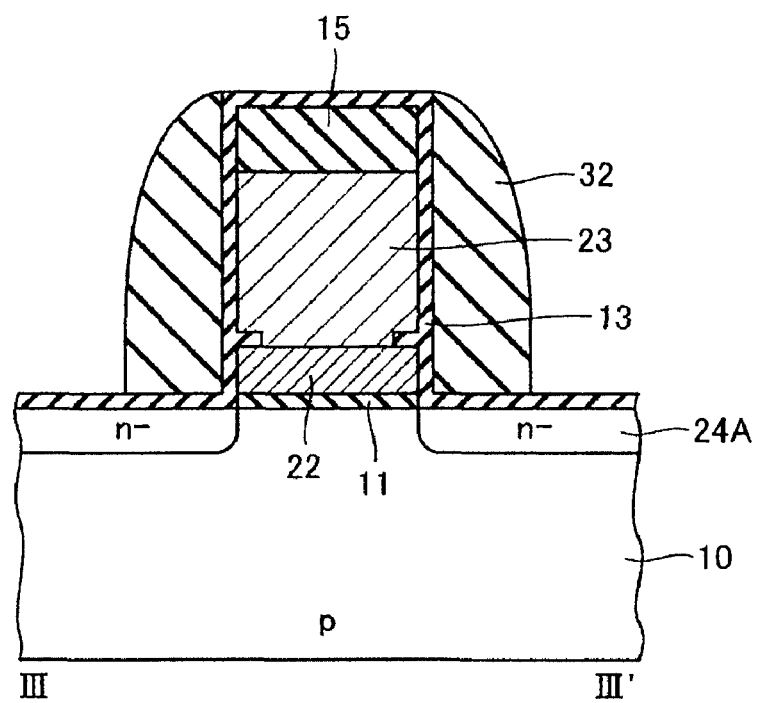
FIG. 18C is a cross-sectional view taken along line III-III' of FIG. 1 showing the NAND type EEPROM in the order of manufacturing processes.
Figure 18F:
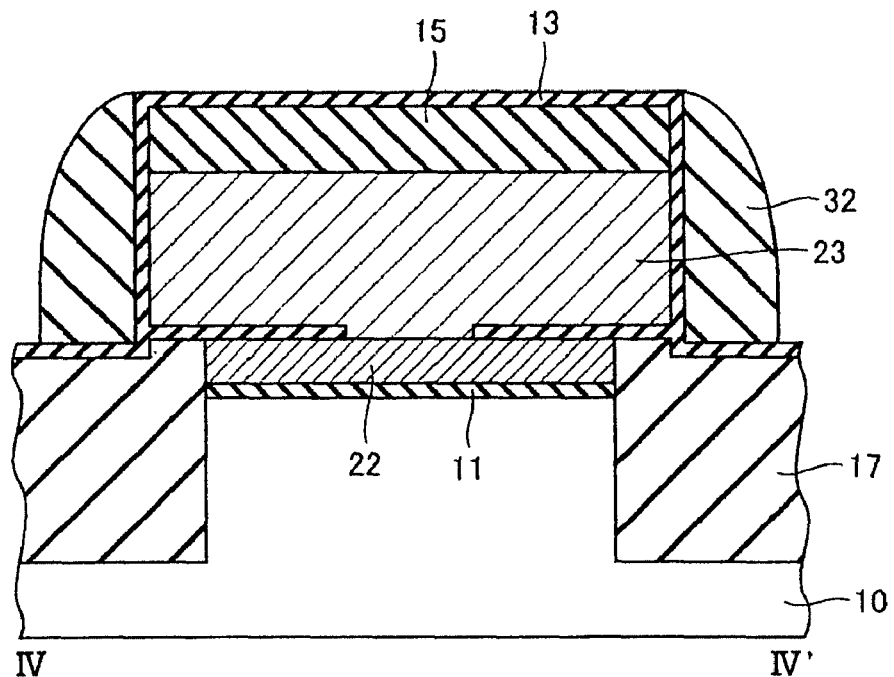
FIG. 18D is a cross-sectional view taken along line IV-IV' of FIG. 1 showing the NAND type EEPROM in the order of manufacturing processes.
Figure 19A:
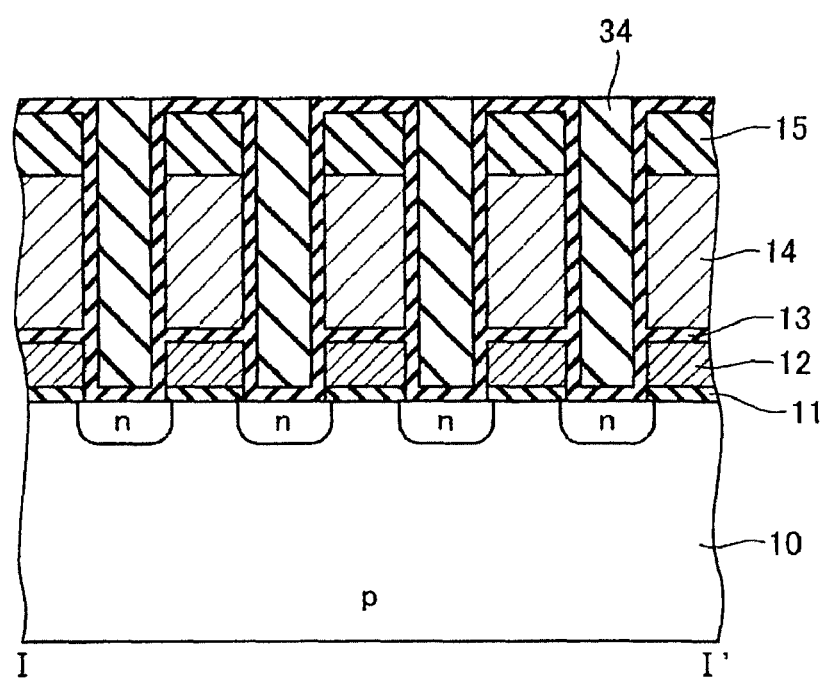
FIG. 19A is a cross-sectional view taken along line I-I' of FIG. 1 showing the NAND type EEPROM in the order of manufacturing processes.
Figure 19B:
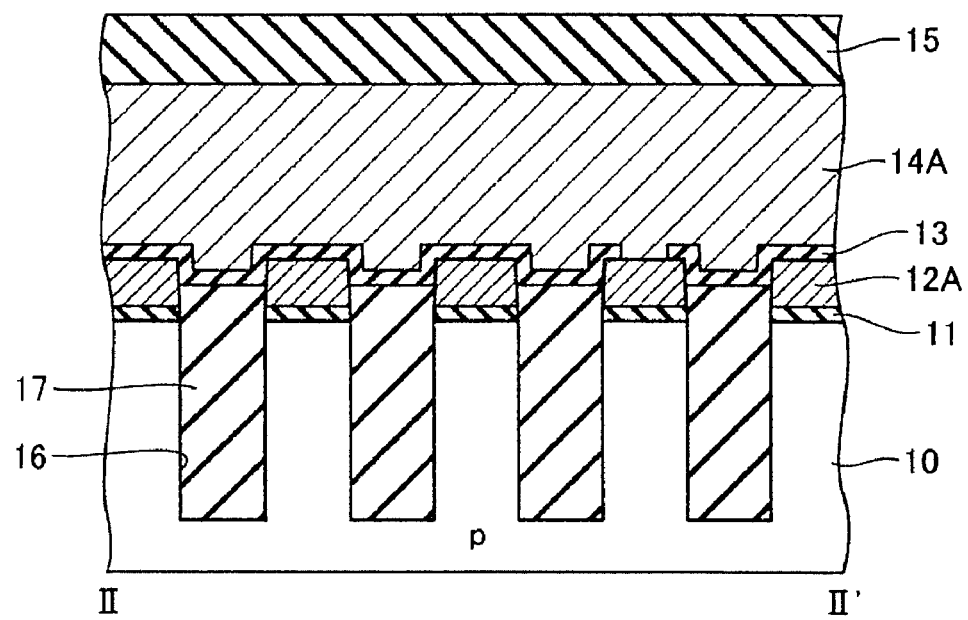
FIG. 19B is a cross-sectional view taken along line II-II' of FIG. 1 showing the NAND type EEPROM in the order of manufacturing processes.
Figure 19C:
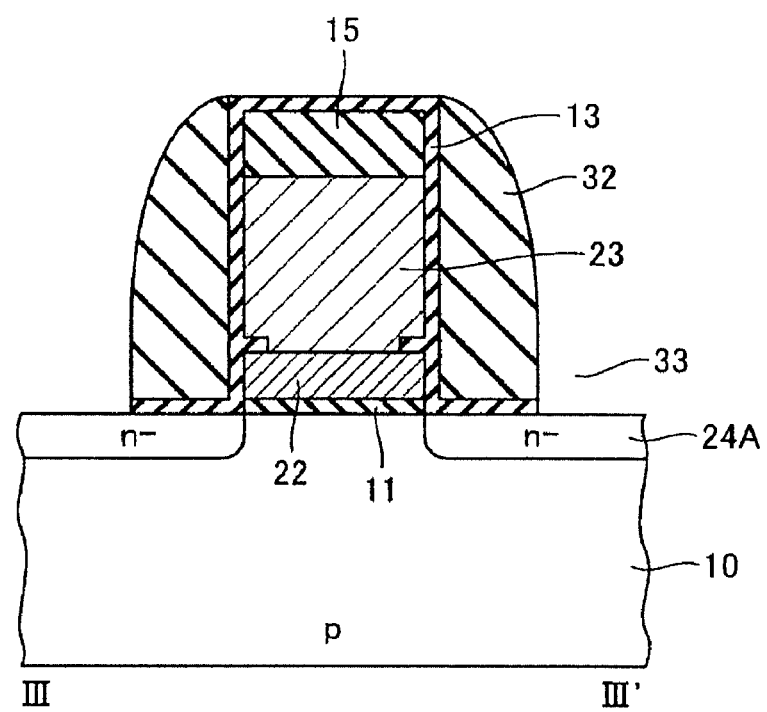
FIG. 19C is a cross-sectional view taken along line III-III' of FIG. 1 showing the NAND type EEPROM in the order of manufacturing processes.
Figure 19:
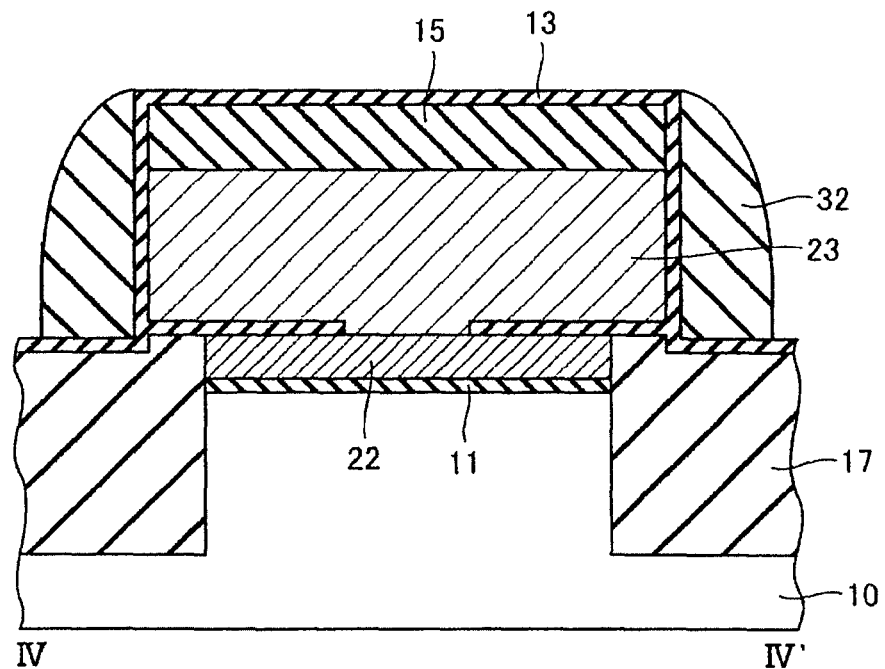
FIG. 19D is a cross-sectional view taken along line IV-IV' of FIG. 1 showing the NAND type EEPROM in the order of manufacturing processes.
Figure 20:
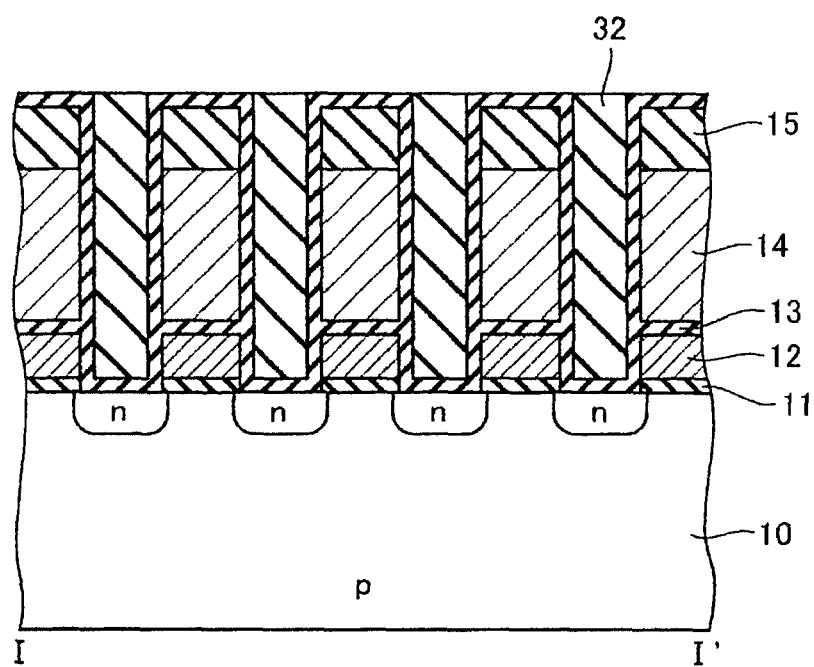
FIG. 20A is a cross-sectional view taken along line I-I' of FIG. 1 showing the NAND type EEPROM in the order of manufacturing processes.
FIG. 20B is a cross-sectional view taken along line II-II' of FIG. 1 showing the NAND type EEPROM in the order of manufacturing processes.
FIG. 20C is a cross-sectional view taken along line III-III' of FIG. 1 showing the NAND type EEPROM in the order of manufacturing processes.
FIG. 20D is a cross-sectional view taken along line IV-IV' of FIG. 1 showing the NAND type EEPROM in the order of manufacturing processes.
Figure 20B:
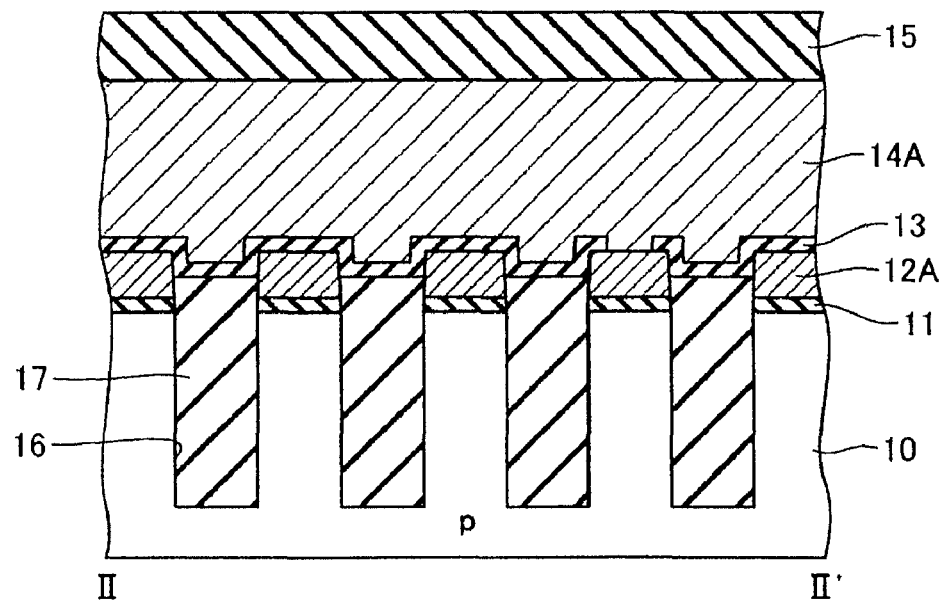
Figure 20C:
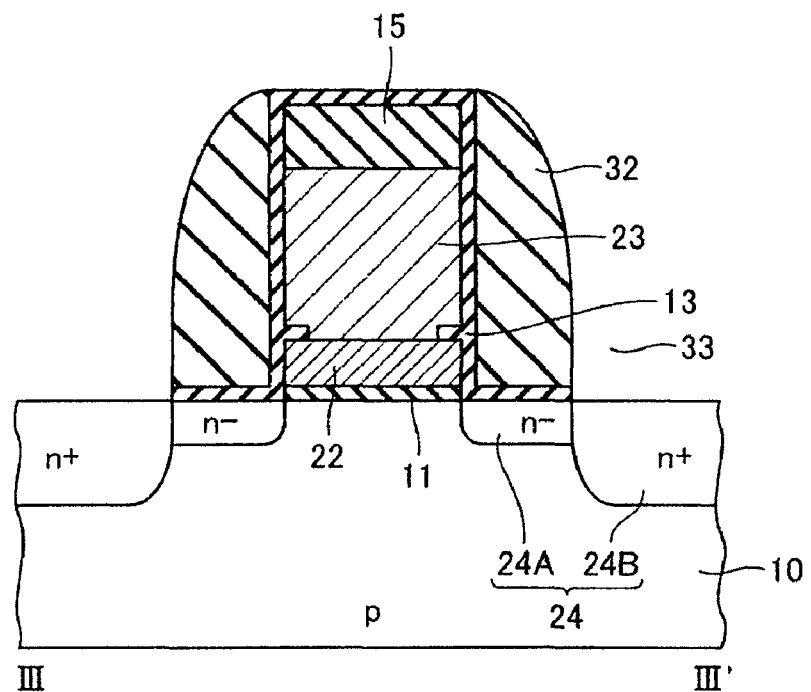
Figure 20D:
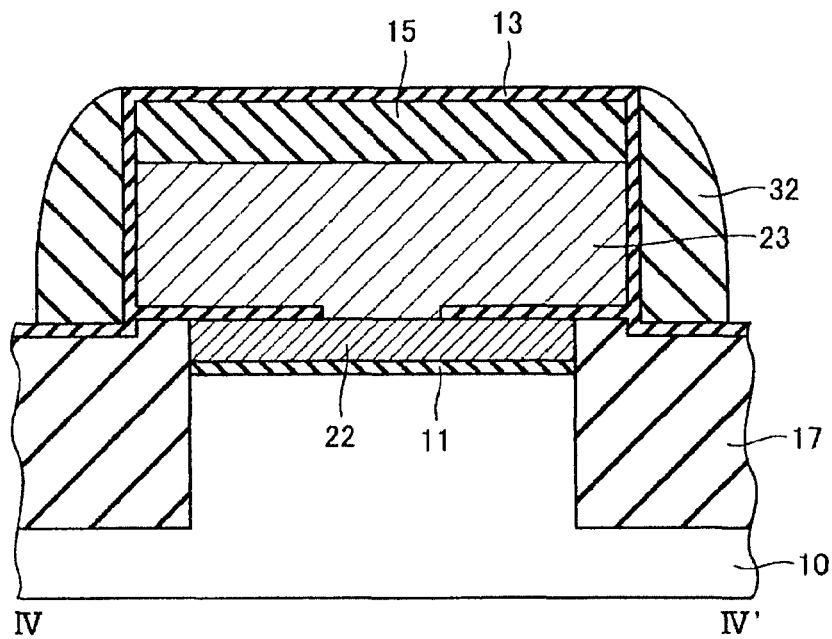

As shown in FIGS. 17A and 17B, the second insulating film 13 composed of a stacked layer film consisting of a silicon oxide film/a silicon nitride film, a silicon nitride film/a silicon oxide film/a silicon nitride film, a silicon nitride film/a silicon oxide film/$Al_2O_3$, or a silicon nitride film/a silicon oxide film/a High-k film is continuously formed between the floating gate 12 and the control gate 14, on the side surface of the floating gate 12 and the control gate 14 along the word line WL, on the upper surface of the silicon nitride film 15 and on the upper surface of the silicon substrate 10 between the layered products by using, for example, an ALD (Atomic Layer Deposition) method. In the peripheral circuit transistor area PA, as shown in FIGS. 17C and 17D, the second insulating film 13 similar to that described above is also continuously formed at the same time between the lower gate 22 and the upper gate 23, on the side surface of the lower gate 22 and the upper gate 23, on the upper surface of the silicon nitride film 15, and on the upper surface of the silicon substrate 10 on both sides of the layered product.

The ALD method is a method in which a gas, used as a raw material, causes samples to be chemically reacted, after the gas is adsorbed on the samples, to form a film through the growth of an atomic layer film. Since the gas is supplied to each air gap between the first polycrystalline silicon film 12A and the second polycrystalline silicon film 14A, the second insulating film 13 is formed not only on the side surface of the lower gate 22 and the upper gate 23, on the upper surface of the silicon nitride film 15 and on the upper surface of the silicon substrate 10 on both sides of the layered product, but also between the lower gate 22 and the upper gate 23 from the exposed surfaces of each of lower gate 22 and upper gate 23. Specifically, the second insulating film 13 between the lower gate 22 and the upper gate 23 is also a stacked layer film consisting of a silicon oxide film/a silicon nitride film/a silicon oxide film, a silicon nitride film/a silicon oxide film/a silicon nitride film/a silicon oxide film/a silicon nitride film, a silicon nitride film/a silicon oxide film/$Al_2O_3$/a silicon oxide film/a silicon nitride film, or a silicon nitride film/a silicon oxide film/a High-k film, for example, SrO, $Al_2O_3$, MgO, $Y_2O_3$, $HfO_2$, $ZrO_2$, $TaO_5$, $Bi_2O_3$, and a silicon oxide film/a silicon nitride film.

As a result, the second insulating film 13 formed between the lower gate 22 and the upper gate 23 is the first stacked layer film consisting of an odd number of layers. The second insulating film 13 formed on the side surface of the lower gate 22 and upper gate 23 along the word line WL consists of $(n+1)/2$ layers, where n denotes the number of the layers of the first stacked layer film.

For example, when the first stacked layer film comprises a silicon nitride film (a first silicon nitride film)/a silicon oxide film (a first silicon oxide film)/a silicon nitride film (a second silicon nitride film)/a silicon oxide film (a second silicon oxide film)/a silicon nitride film (a third silicon nitride film) from the bottom, the second stacked layer film comprises a silicon nitride film (a fourth silicon nitride film)/a silicon oxide film (a third silicon oxide film)/a silicon nitride film (a fifth silicon nitride film) from the side surface of the upper gate and the lower gate. A thickness of the first silicon nitride film, the third silicon nitride film and the fourth silicon nitride film can be the same. A thickness of the first silicon oxide film, the second silicon oxide film and the third silicon oxide film can be the same.

Furthermore, controllability of film thickness is high because the film grows on an atom-by-atom basis. Moreover, a high quality interfacial layer can be formed because its surface is not hit by ions or plasmas. Thus, the voltage resistance between the word lines WL can be improved.

As shown in FIGS. 18A to 18D, a TEOS film is caused to be deposited on the surface by, for example, LPCVD method. The entire surface may be covered. Subsequently, the TEOS film is removed by an anisotropic etching method using an RIE except for the TEOS film located on both side surfaces of the gate electrode. As a result, each space between the memory cells MC is filled with a TEOS film 34, while a first spacer 32 is formed on the side surface of the gate electrode GE in the peripheral circuit transistor area.

As shown in FIGS. 19A to 19D, the second insulating film 13 is removed by, for example, the RIE method using the first spacer 32 as a mask. When the second insulating film 13 contains a nitride film such as a silicon nitride film, the second insulating film 13 exposed to the first spacer 32 and formed on the surface of the silicon substrate 10 can be removed so as to prevent the variation of the electrical properties belonging to the MOS transistor in the peripheral circuit transistor area PA due to fixed charges contained in the nitride film.

As shown in FIGS. 20A to 20D, an n-type impurity is ion-implanted in a high concentration to form the high concentration impurity diffusion region 24B using the first spacers 32 and 33 as a mask.

For example, the interlayer insulating film 21 such as the TEOS is formed on the surface to fill each space between electrodes. The entire surface may be covered. Thereafter, the bit lines BL and the necessary contacts are formed thereby to complete the EEPROM of the first embodiment.

In the NAND type EEPROM according to the first embodiment, one dummy memory cell MC' which does not function as a memory cell is formed in a direction parallel to the bit line BL. Alternatively, two or more dummy memory cells can be formed to support the control gate 14 more firmly. Further, the position in which the dummy memory cell is formed is not limited to the area near the center. Furthermore, multiple dummy memory cells are not always necessary to be formed in the bit line direction, as long as at least one dummy memory cell is formed in every word line WL. In the NAND type EEPROM according to the first embodiment, the dummy memory cell is formed to support the control gate 14 when the pseudo silicon nitride film is removed. Alternatively, for example, the viscosity of the liquid for wetting, which is performed at the time of removing the pseudo silicon nitride film, can be reduced so as to support the control gate 14 even when the number of the dummy memory cells is reduced. This is because the load applied to the control gate 14 is reduced when the pseudo silicon nitride film is removed.

In the process of manufacturing the NAND type EEPROM according to the first embodiment, after the floating gate 12 and the lower gate 22 are formed, the side surfaces of the floating gate 12 and the control gate 14 along the word line WL, and the upper surface of the silicon substrate 10 between the layered products may be covered with a thermally-oxidized thin film having a thickness of about 1 nm so as to correct the damage of these electrodes.

In the NAND type EEPROM according to the first embodiment, the second insulating film 13 is formed by using an ALD method, but the method is not limited to this. Alternatively, the second insulating film 13 may also be formed by using an LPCVD method (Low Pressure CVD method).

Second Embodiment

Figure 21:
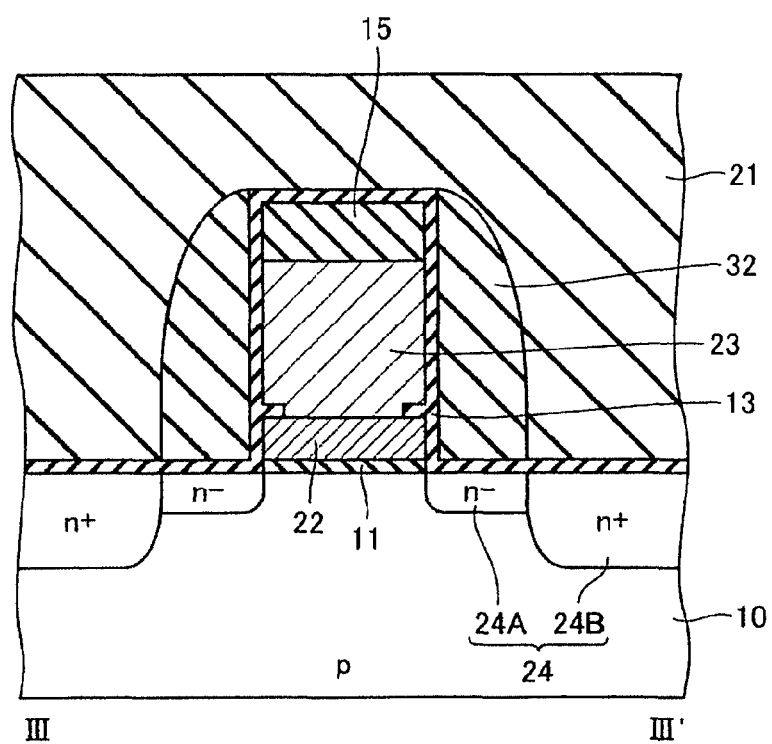
FIG. 21 is a view corresponding to FIG. 4 showing a NAND type EEPROM according to a second embodiment of the present invention.

A NAND type EEPROM (nonvolatile semiconductor memory device) according to a second embodiment of the present invention will then be described. The NAND type EEPROM according to the second embodiment differs from that of the first embodiment in that the second insulating film 13 on the impurity diffusion regions 24A and 24B is not removed in the peripheral circuit transistor area as shown in FIG. 21. In the NAND type EEPROM according to the second embodiment, unlike the first embodiment, the second insulating film 13 is not removed in part after the first spacer 32 is formed, and alternatively, n-type impurities are ion-implanted in a high concentration using the first spacer 32 as a mask to form the high concentration impurity diffusion area 24B.

As a result, the same effect as that of the first embodiment is obtained, as well as a process of removing the second insulating film 13 using the first spacer 32 as a mask can be omitted. In other words, damage to the semiconductor substrate 10 caused by etching performed so as to remove the second insulating film 13 can be reduced.

Third Embodiment

Figure 22:
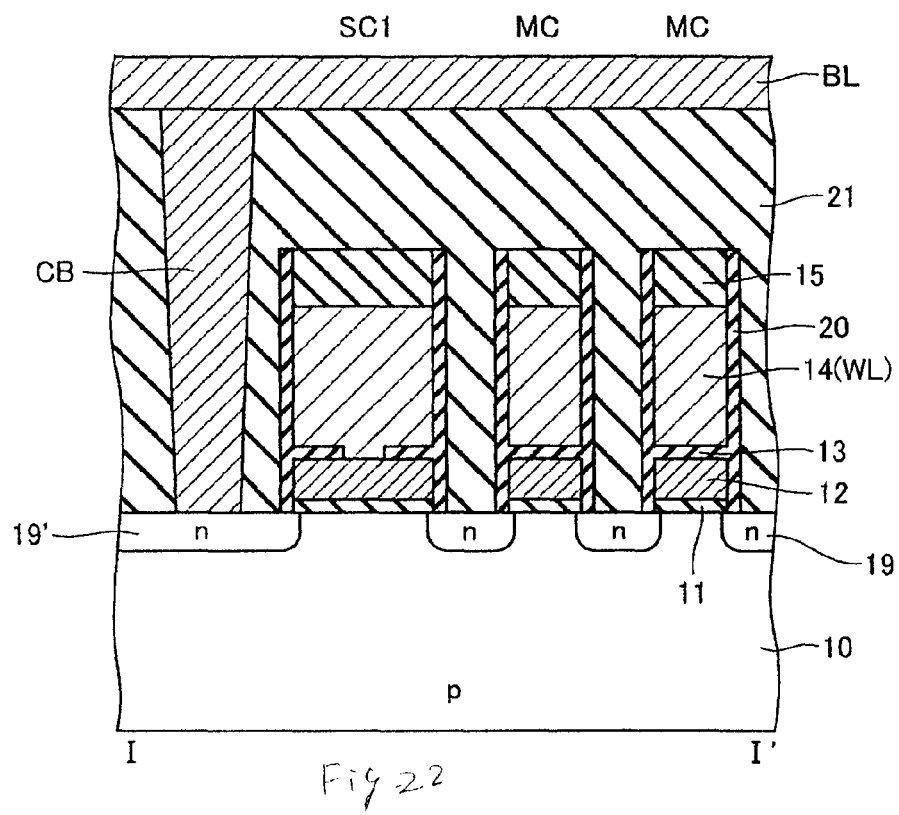
FIG. 22 is a view corresponding to FIG. 2 showing a NAND type EEPROM according to a third embodiment of the present invention.
Figure 23:
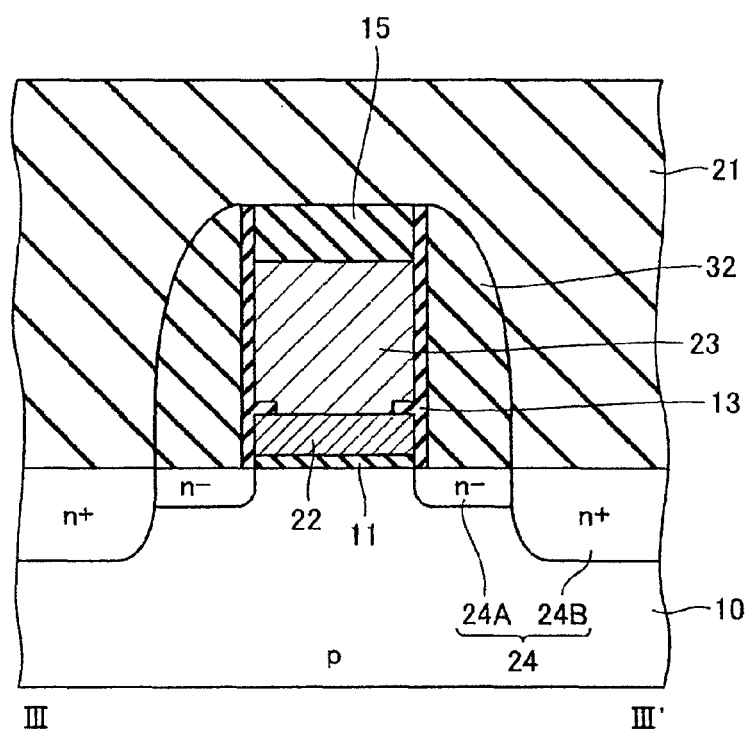
FIG. 23 is a view corresponding to FIG. 4 showing the NAND type EEPROM according to the third embodiment of the present invention.

A NAND type EEPROM (nonvolatile semiconductor memory device) according to a third embodiment of the present invention will then be described. The NAND type EEPROM according to the third embodiment differs from that of the first embodiment in that, as shown in FIGS. 22 and 23, in that the second insulating film 13 is formed only between the floating gate 12 and the control gate 14, and on the side surface along the word line WL of the first insulating film 11, the floating gate 12, the control gate 14, and the silicon nitride film 15. In the NAND type EEPROM according to the third embodiment, unlike in the first embodiment, the second insulating films 13 on the impurity diffusion regions 19, 19', 24A and 24B, and on the silicon nitride film 15 are removed by using an anisotropic etching method such as the RIE before the first spacer is formed.

As a result, the same effect as that of the first embodiment is obtained, while the electric characteristics changes of the memory cell transistor MT due to the fixed electric charge contained in the nitride film can be prevented, when the second insulating film 13 contains nitride film such as silicon nitride film.

Numerous other modifications and variations of the present invention are possible in light of the above teachings. It is therefore to be understood that within the scope of the appended claims, the invention may be practiced otherwise than as specifically described herein.

The invention claimed is:

1. A nonvolatile semiconductor memory device comprising:
    a plurality of memory cells formed on a semiconductor substrate, wherein the memory cells each include
    a first insulating film;
    a floating gate formed on the semiconductor substrate with the first insulating film interposed in between;
    a control gate formed on the floating gate; and
    a second insulating film formed by an ALD (Atomic Layer Deposition) method having a first part and a second part, the first part formed in part of the space between the floating gate and the control gate, the second part formed on the side surfaces of the floating gate and the control gate along a word line, and the first part and the second part made of same material and formed without an interface,
    wherein the first part of the second insulating film comprises a first stacked layer film comprising a plurality of layers.

2. The device according to claim 1, further comprising at least one dummy memory cell formed in each word line and not serving as a memory cell, a floating gate and a control gate of the dummy cell being electrically connected to each other.

3. The device according to claim 1, further comprising a peripheral transistor, wherein
    the peripheral transistor includes
    a lower-layer gate electrode formed on the semiconductor substrate through a third insulating film;
    an upper-layer gate electrode formed on the lower-layer gate electrode; and
    a fourth insulating film formed on the side surfaces of the lower-layer gate electrode and the upper-layer gate electrode and between the lower-layer gate electrode and the upper-layer gate electrode, and the lower-layer gate electrode and the upper-layer gate electrode are connected to each other through an opening in the fourth insulating film.

4. The device according to claim 3, wherein
the floating gate and the lower-layer gate electrode are made of the same material,
the control gate and the upper-layer gate electrode are made of the same material, and
the second insulating film and the fourth insulating film are made of the same material.

5. The device according to claim 1, wherein
the first stacked layer film has an odd number of layers, and
the second part of the second insulating film formed on the side surfaces, along the word line, of the floating gate and the control gate has $(n+1)/2$ layers, where n is the number of the layers of the first stacked layer film.

6. The device according to claim 1, wherein
the first stacked layer comprises a first silicon oxide film, a silicon nitride film, and a second silicon oxide film, and
the second part of the second insulating film formed on the side surfaces, along the word line, of the floating gate and the control gate is a film in which a silicon oxide film and a silicon nitride film are stacked.

7. The device according to claim 1, further comprising:
a selection gate transistor adjoining the memory cell, wherein
the selection gate transistor includes
a lower-layer gate electrode formed on a semiconductor substrate with a third insulating film interposed in between;
an upper-layer gate electrode formed on the lower-layer gate electrode; and
a fourth insulating film formed on the side surfaces of the lower-layer gate electrode and the upper-layer gate electrode and between the lower-layer gate electrode and the upper-layer gate electrode, and
the lower-layer gate electrode and the upper-layer gate electrode are connected to each other through an opening in the fourth insulating film.

8. The device according to claim 3, further comprising:
a side wall insulating film formed on the side surfaces of the lower-layer gate electrode and the upper-layer gate electrode with the second part of the second insulating film interposed in between, wherein
the second part of the second insulating film is formed between the side wall insulating film and the semiconductor substrate continuously from the side surface of the lower-layer gate electrode.

9. The device according to claim 3, further comprising:
a side wall insulating film formed on the side surfaces of the lower-layer gate electrode and the upper-layer gate electrode with the second part of the second insulating film interposed in between, wherein
the under surface of the side wall insulating film is in contact with a surface of the semiconductor substrate.

10. The device according to claim 4, wherein
the first stacked layer comprises a first silicon oxide film, a silicon nitride film, and a second silicon oxide film,
the second part of the second insulating film formed on the side surfaces, along the word line, of the floating gate and the control gate is a film in which a silicon oxide film and a silicon nitride film are stacked,
the fourth insulating film formed between the lower-layer gate and the upper-layer gate is a film in which a silicon oxide film, a silicon nitride film, and a silicon oxide film are stacked, and
the fourth insulating film formed on the side surfaces of the lower-layer gate and the upper-layer gate is a film in which a silicon oxide film and a silicon nitride film are stacked.

11. The device according to claim 1, wherein
the first stacked layer comprises a first silicon nitride film, a first silicon oxide film, a high-k film, a second silicon oxide film, and a second silicon nitride film, and
the second part of the second insulating film formed on the side surfaces, along the word line, of the floating gate and the control gate is a film in which a silicon nitride film, a silicon oxide film, and a high-k film are stacked.

12. The device according to claim 4, wherein
the first stacked layer comprises a first silicon nitride film, a first silicon oxide film, a high-k film, a second silicon oxide film, and a second silicon nitride film,
the second part of the second insulating film formed on the side surfaces, along the word line, of the floating gate and the control gate is a film in which a silicon nitride film, a silicon oxide film, and a high-k film are stacked,
the fourth insulating film formed between the lower-layer gate and the upper-layer gate is a film in which a silicon nitride film, a silicon oxide film, a high-k film, a silicon oxide film, and a silicon nitride film are stacked, and
the fourth insulating film formed on the side surfaces of the lower-layer gate and the upper-layer gate is a film in which a silicon nitride film, a silicon oxide film and a high-k film are stacked.

* * * * *